US012808965B2

(12) United States Patent
Koch et al.

(10) Patent No.: US 12,808,965 B2
(45) Date of Patent: Nov. 24, 2026

(54) DEEP LEARNING-BASED ENHANCEMENT OF MULTISPECTRAL MAGNETIC RESONANCE IMAGING

(71) Applicant: The Medical College of Wisconsin, Inc., Milwaukee, WI (US)

(72) Inventors: Kevin Matthew Koch, Milwaukee, WI (US); Andrew Scott Nencka, Milwaukee, WI (US); Nikolai Jonas Mickevicius, Milwaukee, WI (US)

(73) Assignee: The Medical College of Wisconsin, Inc., Milwaukee, WI (US)

( * ) Notice: Subject to any disclaimer, the term of this patent is extended or adjusted under 35 U.S.C. 154(b) by 208 days.

(21) Appl. No.: 18/864,274

(22) PCT Filed: May 8, 2023

(86) PCT No.: PCT/US2023/021385

§ 371 (c)(1),
(2) Date: Nov. 8, 2024

(87) PCT Pub. No.: WO2023/219963

PCT Pub. Date: Nov. 16, 2023

(65) Prior Publication Data

US 2025/0306149 A1 Oct. 2, 2025

Related U.S. Application Data

(60) Provisional application No. 63/339,482, filed on May 8, 2022.

(51) Int. Cl.

*G01V 3/00* (2006.01)
*G01R 33/56* (2006.01)
*G01R 33/563* (2006.01)

(52) U.S. Cl.

CPC ... *G01R 33/5608* (2013.01); *G01R 33/56341* (2013.01); *G01R 33/5635* (2013.01)

(58) Field of Classification Search

CPC .......... G01R 33/5608; G01R 33/56341; G01R 33/5635
USPC .......................................................... 324/309
See application file for complete search history.

(56) References Cited

U.S. PATENT DOCUMENTS

2019/0146049 A1* 5/2019 Koch .................... A61B 5/055 324/309

OTHER PUBLICATIONS

Koch, K. et al., Multispectral Diffusion-Weighted MRI of the Instrumented Cervical Spinal Cord: A Preliminary Study of 5 Cases, European Spine Journal, 2020, 29:1071-1077.

(Continued)

*Primary Examiner* — Walter L Lindsay, Jr.
*Assistant Examiner* — Frederick Wenderoth
(74) *Attorney, Agent, or Firm* — Quarles & Brady LLP

(57) ABSTRACT

Enhanced multispectral data, spectral bin images reconstructed therefrom, and/or composite images generated from spectral bin images are generated using deep learning-based techniques. As one example, a bin combination approach can be used to improve spatial resolution. As another example, a super-resolution technique can be used to improve spatial resolution. As yet another example, a contrast transformation technique can be used to generate images with a different contrast weighting network from multispectral data acquired from a metal-containing region.

19 Claims, 12 Drawing Sheets

(56) References Cited

OTHER PUBLICATIONS

Shi, X. et al., Accelerated Imaging of Metallic Implants Using a 3D Convolutional Neural Network, Proceedings of the International Society for Magnetic Resonance in Medicine, 2018, 26:4219, 6 pages.
PCT International Search Report and Written Opinion, PCT/US2023/021385, Oct. 12, 2023, 25 pages.

* cited by examiner

DEEP LEARNING-BASED ENHANCEMENT OF MULTISPECTRAL MAGNETIC RESONANCE IMAGING

CROSS-REFERENCE TO RELATED APPLICATIONS

This application represents the national stage entry of PCT/US2023/021385 filed on May 8, 2023 and claims the benefit of U.S. Provisional Patent Application Ser. No. 63/339,482, filed on May 8, 2022, and entitled "DEEP LEARNING RECONSTRUCTION FOR IMPROVED RESOLUTION OF MULTISPECTRAL MAGNETIC RESONANCE IMAGING," the contents of which is herein incorporated by reference in its entirety.

STATEMENT OF FEDERALLY SPONSORED RESEARCH

This invention was made with government support under EB030123 awarded by the National Institutes of Health. The government has certain rights in the invention.

BACKGROUND

Magnetic resonance imaging ("MRI") in the presence of metallic implants is confounded by inhomogeneities in the polarizing magnetic field caused by the interaction of the magnetic field with the implants with magnetic susceptibilities which are different from the surrounding tissue. To address this confound, acquisitions have been developed to account for magnetic field inhomogeneities which require further encoding of the signal measured with MRI.

The physics associated with these multispectral imaging ("MSI") acquisitions yields reduced effective image resolution. Combination of images encoded with different resonant frequencies suffers from decreased effective resolution in the frequency encoding direction. This resolution degradation is due to voxel shifts in opposite directions in separate off-resonance encoded acquisitions as imaging frequency goes from less than to greater than the true off-resonance frequency at a voxel. When these resonant frequency encoded "bins" are combined to yield a composite image, the opposing shifts yield an effective blurring in the frequency encoding direction. Further, due to the extended duration of acquisition resulting from the need for further encoding, MSI acquisitions are generally acquired with a spatial resolution which is lower than other, standard clinical acquisitions which are utilized when significant magnetic field inhomogeneities are not present.

SUMMARY OF THE DISCLOSURE

It is an aspect of the present disclosure to provide a method for multispectral magnetic resonance imaging, which includes accessing multispectral data with a computer system, where the multispectral data have been acquired from a first region in a subject using a magnetic resonance imaging ("MRI") system and where the first region contains a metal object. Magnetic resonance imaging data are also accessed with the computer system, where the magnetic resonance imaging data have been acquired from a second region in the subject using the MRI system. The second region does not contain the metal object and partially overlaps the first region in an overlap region. A neural network is accessed with the computer system. The neural network is trained on training data using the computer system, where the training data include multispectral data acquired from the overlap region and magnetic resonance imaging data acquired from the overlap region. The neural network is trained on the training data to generate enhanced multispectral data. The multispectral data acquired from the first region are then input to the neural network using the computer system, generating enhanced multispectral data depicting the first region as an output. The enhanced multispectral data are then output using the computer system.

It is another aspect of the present disclosure to provide a method for multispectral magnetic resonance imaging, which includes accessing multispectral data and magnetic resonance imaging data with a computer system. The multispectral data are acquired from a first region in a subject at a first spatial resolution using an MRI system, where the first region contains a metal object, and the magnetic resonance imaging data are acquired from a second region in the subject at a second spatial resolution, where the second region does not contain the metal object and the second spatial resolution is higher than the first spatial resolution. A neural network is accessed with the computer system, and the neural network is trained, or has been trained, on training data including the magnetic resonance imaging data in order to increase spatial resolution of the multispectral data. Higher resolution multispectral data are generated with the computer system by inputting the multispectral data to the neural network, generating an output as higher spatial resolution multispectral data having a spatial resolution higher than the first spatial resolution.

It is yet another aspect of the present disclosure to provide a method for multispectral magnetic resonance imaging. The method includes accessing multispectral data with a computer system, where the multispectral data have been acquired from a subject using an MRI system. A neural network is also accessed with the computer system, where the neural network has been trained on training data to increase spatial resolution when combining spectral bin images. A set of spectral bin images is reconstructed from the multispectral data using the computer system, and a composite image is generated with the computer system by inputting the set of spectral bin images to the neural network, generating an output as the composite image. The spatial resolution of the composite image is increased relative to the set of spectral bin images.

It is still another aspect of the present disclosure to provide a method for training a neural network to generate enhanced multispectral data. The method includes accessing multispectral data with a computer system, where the multispectral data have been acquired from a first region in a subject using an MRI system and where the first region contains a metal object. Magnetic resonance imaging data are also accessed with the computer system, where the magnetic resonance imaging data have been acquired from a second region in the subject using the MRI system. The second region does not contain the metal object and partially overlaps the first region in an overlap region. Training data are assembled from the multispectral data acquired from the overlap region and the magnetic resonance imaging data acquired from the overlap region. A neural network is then trained on the training data using the computer system.

The foregoing and other aspects and advantages of the present disclosure will appear from the following description. In the description, reference is made to the accompanying drawings that form a part hereof, and in which there is shown by way of illustration one or more embodiments. These embodiments do not necessarily represent the full scope of the invention, however, and reference is therefore made to the claims and herein for interpreting the scope of the invention.

DETAILED DESCRIPTION

Figure 1:
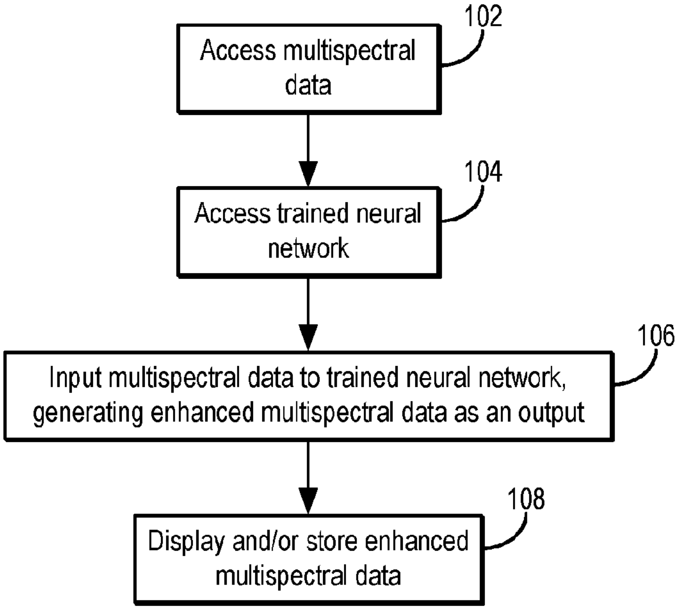
FIG. 1 is a flowchart illustrating the steps of an example method for generating enhanced multispectral data from input multispectral data.

Described here are systems and methods for enhancing images in multispectral imaging techniques, such as by improving spatial resolution, reducing noise, transferring contrast weighting from other magnetic resonance images, and so on. In general, deep learning ("DL") models are trained, or retrained, on training data that include multispectral data acquired from a metal-containing region in a subject, and a second magnetic resonance dataset acquired from outside of the metal-containing region, but where the multispectral data and second magnetic resonance data at least partially overlap in an overlap region. The multispectral data and second magnetic resonance data acquired from the overlap region may be used as training data to train, or retrain, a deep learning model for image enhancement of images reconstructed or otherwise generated from the multispectral data. As one example, a bin combination approach can be used to improve spatial resolution. As another example, a super-resolution technique can be used to improve spatial resolution. In still other examples, a joint bin combination and super-resolution technique can be used to improve spatial resolution. In yet other examples, the contrast weighting from the second magnetic resonance data may be transferred to the multispectral data; that is, images with the contrast weighting of the second magnetic resonance data may be generated from the multispectral data acquired from the metal-containing region. In this way, images of the metal-containing region can be generated with a contrast weighting that may not otherwise be attainable with multispectral imaging techniques.

Imaging in the presence of metallic implants presents a unique opportunity for patient-specific image inference optimizations. In these instances, conventional images acquired from a metal-containing region will be corrupted by artifacts (e.g., signal dropouts, etc.) from the metal, whereas conventional images acquired from outside of the metal-containing region will not be affected by metal-induced artifacts. In such cases, standard, high-resolution acquisitions may be performed in the regions outside of the metal-containing region to achieve high-quality images of those regions while multispectral acquisitions may be acquired from the metal-containing region to achieve lower resolution diagnostic images in the region of the implant or other metallic object. Thus, multispectral data may be acquired from a first region containing a metallic object and other magnetic resonance imaging data may be acquired from a second region outside of the metal-containing region, but such that the first region and second region at least partially overlap in an overlap region. As such, the overlap region is imaged with both standard high-resolution and lower resolution multispectral techniques. This allows for the patient-specific training of deep learning models to enhance multispectral images where training occurs in regions of artifact-free image overlap (i.e., the overlap region).

Multispectral data may be acquired from the first region and higher resolution magnetic resonance imaging data may be acquired from the second region. A deep learning model is trained on training data that includes multispectral data and magnetic resonance imaging data acquired from the overlap between the first and second region (i.e., the overlap region). Alternatively, a pretrained deep learning model may be retrained on such training data, such as by using transfer learning or the like. Multispectral data may then be input to the deep learning model to generate higher resolution multispectral data, spectral bin images, composite images, or combinations thereof.

As another example, multispectral data may be input to the deep learning model to generate images of the first region (i.e., the metal-containing region) having an image contrast weighting that is transferred from the magnetic resonance imaging data acquired from the second region. For instance, the contrast weighting of the magnetic resonance imaging data may be a T1-weighting, a T2-weighting, proton density weighting, inversion recovery weighting (e.g., STIR, FLAIR), diffusion weighting, perfusion weighting, and so on. As one non-limiting example, vascular contrast, similar to time-of-flight angiography, may be inferred from standard multispectral images where vascular contrast is observed with flow voids. The inferred vascular image is of lower resolution than the standard time-of-flight acquisition, but achieves bright vessel contrast in areas that would otherwise be obscured by metal-induced artifacts. In this way, a deep learning model (e.g., a deep neural network) can be trained on data acquired from the overlap region within a single subject to yield a contrast transform on the multispectral images and achieve similar contrast to traditional acquisitions in the metal-containing region where conventional imaging acquisitions are obscured by metal artifacts.

In some examples, the enhanced multispectral data generated using the systems and methods described in the present disclosure may include a bin-combined, deblurred image (i.e., a higher spatial resolution composite image). In general, a bin combination technique can be used to address the loss of spatial information in the generation of a composite image from the individual spectral bin images. Previous examples of bin combination techniques generate a spatial map of off-resonance through the relative intensities of the images acquired with each off-resonance step. The voxels at each spatial location in each bin image are shifted in the frequency-encoding direction based on the frequency offset between the acquired bin and the calculated off-resonance map to yield "corrected" spectral bin images. The corrected spectral bin images are then combined, such as by using a standard square root of the sum-of-squares combination.

These previous algorithms are limited by several factors. The off-resonance map must be accurately calculated at a spatial resolution that is sufficient to resolve the spatial offsets in the frequency-encoding direction. The algorithm used for shifting voxels in the frequency-encoding direction (usually linear, cubic, or sinc interpolation) can also be imperfect and introduce further artifacts (e.g., Gibbs ringing with sinc interpolation or further blurring with linear interpolation). Further, the sum-of-squares combination assumes that the spectral profiles of the bins are distributed such that the sum of their squares yields a flat response across the imaged band of frequency offsets (an assumption known to fail with the bins that are farthest off-resonance).

In the systems and methods described in the present disclosure, components of the standard bin combination workflow are replaced by neural networks, such as convolutional neural networks ("CNNs"). Due to the physics-based source of blurring in the bin combination process, both simulated and experimentally collected data can be used in the training process. There are multiple different CNNs that can be trained for image de-blurring through bin combination. For instance, the CNN can include an encoder/decoder network, such as a CNN having a U-Net or V-Net architecture.

In some examples, the enhanced multispectral data generated using the systems and methods described in the present disclosure may include higher resolution multispectral data, spectral bin images, and/or composite images. Conventional super-resolution algorithms generally utilize a priori assumptions of image characteristics, or require the repeated acquisition of an image dataset. Advantageously, multispectral imaging can provide a dataset that is amenable for subject-specific and/or exam-specific applications of super-resolution technologies. Such exam-specific applications can provide a level of freedom from the underlying apriori assumptions of other super-resolution techniques while not requiring the acquisition of further imaging data beyond what is acquired in a conventional MSI acquisition.

As noted above, in clinical exams that include imaging around metallic hardware, MSI techniques can be utilized to yield diagnostic-quality images in the neighborhood of metallic foreign bodies, and standard imaging techniques can additionally be utilized to yield diagnostic-quality images in locations that are more distant from the metallic foreign bodies. The standard imaging techniques yield higher spatial resolutions than the MSI techniques, facilitating radiologist interpretation and allowing the detection of pathology on much finer spatial scales.

The MSI acquisitions and standard imaging acquisitions can be designed such that there is a significant overlap of the imaged volume between the MSI and standard imaging acquisitions. Further, through the field map computed in the MSI reconstruction, spatial regions that are known to be artifact-free in the standard imaging acquisition can be identified. In those regions, both low-resolution MSI image data and high-resolution standard image data are available.

To achieve exam-specific super-resolution in these cases, a super-resolution deep learning algorithm can be employed. As a non-limiting example, the super-resolution algorithm can optionally be initially trained with simulated data including ground truth grayscale images and matching grayscale images that have been resampled to a lower spatial resolution. Image regions identified to be artifact-free in the standard imaging data can be extracted as high-resolution "ground truth" data and the spatially matching MST image data can be extracted as algorithm inputs. With potential further data augmentation (e.g., geometric distortion, addition of noise, etc.) the deep learning super-resolution model is trained (either de novo or via transfer learning with initial model weights defined by initial training with simulated data).

Once training is complete, the multispectral data are input to the super-resolution model, generating an output as higher resolution multispectral data (e.g., having spatial resolution that approaches that of the standard acquisition), which in some instances may include higher resolution spectral bin images, a higher resolution composite image, or both. The super-resolution MSI image contains equivalent image quality as the standard acquisition throughout the full imaged field-of-view of the MSI acquisition (both in areas where the standard acquisition yields appropriate diagnostic quality and in regions where the MSI acquisition is necessary). Optionally, a subset of artifact-free image patches can be withheld from training as validation regions and super-resolution performance can be estimated on an exam-specific basis through a similarity metric between the super-resolution MSI image and the standard acquisition image, which can be reported through a summary metric and/or through an image showing a correlation heat map.

This second-level training using overlapping regions of high-resolution traditional imaging and lower-resolution MSI imaging provides a few advantages. As one example, super-resolution quality can be assessed on an exam-specific basis. This offers those interpreting the images a scale of confidence in the performance of the application and super-resolution images can be generated only if this assessment reaches a critical threshold. As another example, contrast differences between training data and acquired data can be addressed through the exam-specific training. While subtle contrast differences may be present between the standard and MSI acquisitions due to differences in acquisition parameters, the unique training for each MSI acquisition can effectively model the contrast difference.

The super-resolution-based method can be used independently from the bin combination-based method, or alternatively the two methods can be jointly used. For instance, the super-resolution-based method can be used to improve the spatial resolution of multispectral data (e.g., higher resolution spectral bin images), which can then be input to the bin combination-based method to generate a higher resolution composite image. Additionally or alternatively, the contrast-transformation method can be used independently from the super-resolution-based method, or alternatively the two methods can be jointly used. For instance, the contrast-transformation-based method can be used to generate images with a different contrast weighting, which can then be input to a super-resolution-based deep learning model to generate higher resolution images.

Referring now to FIG. 1, a flowchart is illustrated as setting forth the steps of an example method for generating enhanced multispectral data using a suitably trained neural network or other machine learning algorithm. As will be described, the neural network or other machine learning algorithm takes multispectral data as input data and generates enhanced multispectral data as output data. As an example, the enhanced multispectral data may be higher resolution multispectral data, spectral bin images, and/or composite images. As another example, the enhanced multispectral data may include multispectral data with reduced noise. As yet another example, the enhanced multispectral data may include contrast-transformed multispectral data containing images of the metal containing region from which multispectral data were acquired, but having a different contrast weighting.

The method includes accessing multispectral data with a computer system, as indicated at step 102. Accessing the multispectral data may include retrieving such data from a memory or other suitable data storage device or medium. Additionally or alternatively, accessing the multispectral data may include acquiring such data with an MR system and transferring or otherwise communicating the data to the computer system, which may be a part of the MRI system.

A trained neural network (or other suitable machine learning algorithm) is then accessed with the computer system, as indicated at step 104. In general, the neural network is trained, or has been trained, on training data in order to generate enhanced multispectral data from an input of multispectral data.

Accessing the trained neural network may include accessing network parameters (e.g., weights, biases, or both) that have been optimized or otherwise estimated by training the neural network on training data. In some instances, retrieving the neural network can also include retrieving, constructing, or otherwise accessing the particular neural network architecture to be implemented. For instance, data pertaining to the layers in the neural network architecture (e.g., number of layers, type of layers, ordering of layers, connections between layers, hyperparameters for layers) may be retrieved, selected, constructed, or otherwise accessed.

An artificial neural network generally includes an input layer, one or more hidden layers (or nodes), and an output layer. Typically, the input layer includes as many nodes as inputs provided to the artificial neural network. The number (and the type) of inputs provided to the artificial neural network may vary based on the particular task for the artificial neural network.

The input layer connects to one or more hidden layers. The number of hidden layers varies and may depend on the particular task for the artificial neural network. Additionally, each hidden layer may have a different number of nodes and may be connected to the next layer differently. For example, each node of the input layer may be connected to each node of the first hidden layer. The connection between each node of the input layer and each node of the first hidden layer may be assigned a weight parameter. Additionally, each node of the neural network may also be assigned a bias value. In some configurations, each node of the first hidden layer may not be connected to each node of the second hidden layer. That is, there may be some nodes of the first hidden layer that are not connected to all of the nodes of the second hidden layer. The connections between the nodes of the first hidden layers and the second hidden layers are each assigned different weight parameters. Each node of the hidden layer is generally associated with an activation function. The activation function defines how the hidden layer is to process the input received from the input layer or from a previous input or hidden layer. These activation functions may vary and be based on the type of task associated with the artificial neural network and also on the specific type of hidden layer implemented.

Each hidden layer may perform a different function. For example, some hidden layers can be convolutional hidden layers which can, in some instances, reduce the dimensionality of the inputs. Other hidden layers can perform statistical functions such as max pooling, which may reduce a group of inputs to the maximum value; an averaging layer; batch normalization; and other such functions. In some of the hidden layers each node is connected to each node of the next hidden layer, which may be referred to then as dense layers. Some neural networks including more than, for example, three hidden layers may be considered deep neural networks.

The last hidden layer in the artificial neural network is connected to the output layer. Similar to the input layer, the output layer typically has the same number of nodes as the possible outputs.

The multispectral data are then input to the one or more trained neural networks, generating output as enhanced multispectral data, as indicated at step 106. In some instances, spectral bin images can be reconstructed from the multispectral data and input to the neural network. Additionally or alternatively, off-resonance frequency maps and/or other spectral information (e.g., spectral bin frequencies) can be applied as inputs to the neural network. The enhanced multispectral data generated as an output of the neural network may include higher resolution multispectral data, spectral bin images, and/or composite images. Additionally or alternatively, the enhanced multispectral data may include multispectral data with reduced noise. As yet another example, the enhanced multispectral data may include contrast-transformed multispectral data containing images of the metal containing region from which multispectral data were acquired, but having a different contrast weighting.

In some examples, an off-resonance map, spectral bin images, and spectral bin frequencies are input to the trained neural network, generating an output as a bin-combined, deblurred image (i.e., a higher spatial resolution composite image). In some other examples, a separately acquired off-resonance map with potentially different spatial resolution, spectral bin images, and spectral bin frequencies are input to the trained neural network. In this instance, the neural network may output a bin-combined deblurred image (i.e., a higher spatial resolution composite image). Additionally or alternatively, the neural network can also generate an output as a full-resolution off-resonance map. In still another example, spectral bin images and spectral bin frequencies can be input to the neural network. In this example, the neural network can generate an output as a bin-combined deblurred image (i.e., a higher spatial resolution composite image). Additionally or alternatively, the neural network can generate an output as an off-resonance map.

The enhanced multispectral data generated by inputting the multispectral data to the trained neural network(s) can then be displayed to a user, stored for later use or further processing, or both, as indicated at step 108.

Figure 2:
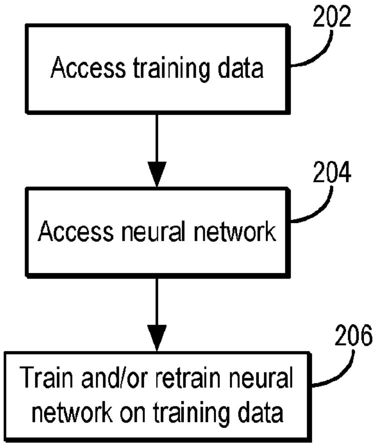
FIG. 2 is a flowchart setting forth the steps of an example method for training a neural network, and/or retraining or fine-tuning a pretrained neural network, to generate enhanced multispectral data from input multispectral data.

Referring now to FIG. 2, a flowchart is illustrated as setting forth the steps of an example method for training one or more neural networks (or other suitable machine learning algorithms) on training data, such that the one or more neural networks are trained to receive multispectral data as input data in order to generate enhanced multispectral data as an output.

In general, the neural network(s) can implement any number of different neural network architectures. For instance, the neural network(s) could implement a convolutional neural network, a residual neural network, or the like.

The method includes accessing training data with a computer system, as indicated at step 202. Accessing the training data may include retrieving such data from a memory or other suitable data storage device or medium. Alternatively, accessing the training data may include acquiring such data with an MRI system and transferring or otherwise communicating the data to the computer system.

In some examples, the training data may be synthetically generated using grayscale natural images. For instance, a digital object of known magnetic susceptibility can be algorithmically placed into a natural image, and a forward model can be applied to the modified image to compute the magnetic field offset throughout the image. Synthetic spectral bin images can then be generated based on a defined bin profile, grayscale image, and computed frequency offset. The ground truth can be the original grayscale natural images and the network inputs can be the simulated spectral bin images, spectral bin frequencies, and off-resonance map (of arbitrary resolution if necessary for either network input or output).

As another example, the training data may include simulated data including ground truth grayscale images and matching grayscale images that have been resampled to a lower spatial resolution. Image regions identified to be artifact-free in the standard imaging data can be extracted as high-resolution "ground truth" data and the spatially matching MSI image data can be extracted as algorithm inputs.

In some other examples, the training data may include subject-specific training data. For instance, the subject-specific training data may include multispectral data acquired from a first region of an imaging volume and magnetic resonance imaging data acquired from a second region of the imaging volume. The first region may contain a metallic object, whereas the second region does not contain a metallic object. The first and second regions at least partially overlap in an overlap region. The training data may be formed from multispectral data and magnetic resonance data acquired from that overlap region. In general, the magnetic resonance imaging data may include conventional magnetic resonance imaging data (e.g., anatomical images). For example, the magnetic resonance imaging data may include conventional high-resolution 2D fast/turbo spin echo images. When the images include regions corrupted by metal artifacts, those regions may be masked to provide training labels.

The method can include assembling training data from multispectral data and/or magnetic resonance imaging data using a computer system. This step may include assembling the data into an appropriate data structure on which the neural network or other machine learning algorithm can be trained. Assembling the training data may include generating labeled data and including the labeled data in the training data. Labeled data may include magnetic resonance imaging data that have been labeled, such as by automatically identifying regions where the images are contaminated by metal artifacts (and/or regions where the images are not contaminated).

Assembling the training data may also include performing data augmentation to generate the undersampled/downsampled images from the multispectral data and/or magnetic resonance imaging data and storing those undersampled/downsampled images as part of the training data. As an example, the undersampled/downsampled images can be generated by making copies of images in the multispectral data and/or magnetic resonance imaging data while undersampling and/or downsampling the images along at least one spatial dimension. Additionally or alternatively, the data augmentation may also include generating cloned data from the multispectral data and/or magnetic resonance imaging data, upsampled images, and/or downsampled images. For instance, cloned data can be generated using data augmentation techniques such as adding noise to the original images, performing a deformable transformation (e.g., translation, rotation, both) on the original images, smoothing the original images, applying a random geometric perturbation to the original images, combinations thereof, and so on.

One or more neural networks (or other suitable machine learning algorithms) are trained on the training data, as indicated at step 204. Additionally or alternatively, a pretrained neural network may be retrained and/or fine-tuned on the training data, such as by using transfer learning, or the like. In general, the neural network can be trained by optimizing network parameters (e.g., weights, biases, or both) based on minimizing a loss function. As one non-limiting example, the loss function may be a mean-squared error loss function.

Training a neural network may include initializing the neural network, such as by computing, estimating, or otherwise selecting initial network parameters (e.g., weights, biases, or both). During training, an artificial neural network receives the inputs for a training example and generates an output using the bias for each node, and the connections between each node and the corresponding weights. For instance, training data can be input to the initialized neural network, generating output as enhanced multispectral data. The artificial neural network then compares the generated output with the actual output of the training example in order to evaluate the quality of the output data. For instance, the output data can be passed to a loss function to compute an error. The current neural network can then be updated based on the calculated error (e.g., using backpropagation methods based on the calculated error). For instance, the current neural network can be updated by updating the network parameters (e.g., weights, biases, or both) in order to minimize the loss according to the loss function. The training continues until a training condition is met. The training condition may correspond to, for example, a predetermined number of training examples being used, a minimum accuracy threshold being reached during training and validation, a predetermined number of validation iterations being completed, and the like. When the training condition has been met (e.g., by determining whether an error threshold or other stopping criterion has been satisfied), the current neural network and its associated network parameters represent the trained neural network. Different types of training processes can be used to adjust the bias values and the weights of the node connections based on the training examples. The training processes may include, for example, gradient descent, Newton's method, conjugate gradient, quasi-Newton, Levenberg-Marquardt, among others.

The artificial neural network can be constructed or otherwise trained based on training data using one or more different learning techniques, such as supervised learning, unsupervised learning, reinforcement learning, ensemble learning, active learning, transfer learning, or other suitable learning techniques for neural networks. As an example, supervised learning involves presenting a computer system with example inputs and their actual outputs (e.g., categorizations). In these instances, the artificial neural network is configured to learn a general rule or model that maps the inputs to the outputs based on the provided example input-output pairs.

The one or more trained neural networks are then stored for later use, as indicated at step 206. Storing the neural network(s) may include storing network parameters (e.g., weights, biases, or both), which have been computed or otherwise estimated by training the neural network(s) on the training data. Storing the trained neural network(s) may also include storing the particular neural network architecture to be implemented. For instance, data pertaining to the layers in the neural network architecture (e.g., number of layers, type of layers, ordering of layers, connections between layers, hyperparameters for layers) may be stored.

Figure 3:
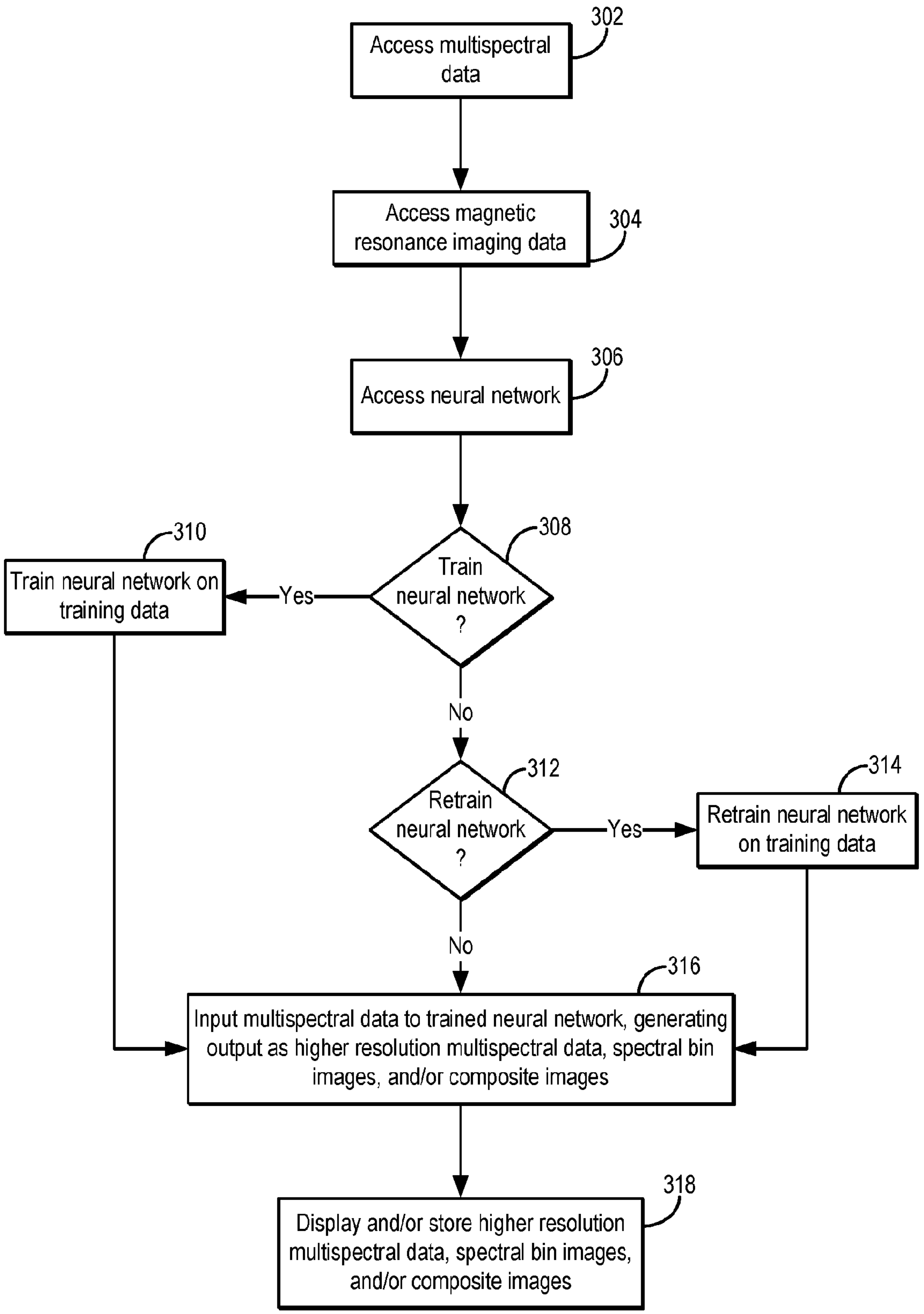
FIG. 3 is a flowchart setting forth the steps of an example method for generating enhanced multispectral data as higher resolution multispectral data, spectral bin images, and/or composite images.

Referring now to FIG. 3, a flowchart is illustrated as setting forth the steps of an example method for generating higher resolution multispectral data, spectral bin images, and/or composite images using a suitably trained neural network or other machine learning algorithm. As will be described, the neural network or other machine learning algorithm takes multispectral data as input data and generates higher resolution multispectral data, spectral bin images, and/or composite images as output data.

The method includes accessing multispectral data with a computer system, as indicated at step 302. Accessing the multispectral data may include retrieving such data from a memory or other suitable data storage device or medium. Additionally or alternatively, accessing the multispectral data may include acquiring such data with an MRI system and transferring or otherwise communicating the data to the computer system, which may be a part of the MRI system. Likewise, in some example implementations, magnetic resonance imaging data (e.g., standard anatomical imaging data) can be accessed with the computer system, as indicated at step 304. Accessing the magnetic resonance imaging data can include retrieving previously acquired data from a memory or other data storage medium or device. Additionally or alternatively, accessing the data can include acquiring magnetic resonance imaging data with an MRI system and providing the data to the computer system, which may be a part of the MRI system.

The magnetic resonance imaging data may include images acquired within the same examination as the multispectral data. For example, the multispectral data and magnetic resonance imaging data may be acquired from an imaging volume in the subject. The multispectral data may be acquired from a first region in the imaging volume, where the first region contains a metallic object. The magnetic resonance imaging data may be acquired from a second region in the imaging volume, where the second region does not contain a metallic object. The first region and the second region may be at least partially overlapping in an overlap region.

In general, the multispectral data are acquired with a first spatial resolution and the magnetic resonance imaging data are acquired with a second spatial resolution that is higher than the first spatial resolution.

A neural network (or other suitable machine learning algorithm) is then accessed with the computer system, as indicated at step 306. In general, the neural network is trained, or has been trained, on training data in order to generate higher resolution multispectral data, spectral bin images, and/or composite images.

When the accessed neural network has yet to be trained, it may be trained on training data, as indicated by decision block 308 and step 310. The training data may be formed from multispectral data and magnetic resonance imaging data acquired from an overlap region (e.g., an overlap between a first region containing a metallic object and a second region not containing a metallic object, as described above). In other examples, when the accessed neural network is a pretrained neural network, it may be retrained on training data, as indicated by decision block 312 and step 314. Again, the training data may be formed from multispectral data and magnetic resonance imaging data acquired from the overlap region. In still other examples, the neural network may be a pretrained neural network that is not retrained or updated.

Accessing a pretrained neural network may include accessing network parameters (e.g., weights, biases, or both) that have been optimized or otherwise estimated by training the neural network on training data. In some instances, retrieving the neural network can also include retrieving, constructing, or otherwise accessing the particular neural network architecture to be implemented. For instance, data pertaining to the layers in the neural network architecture (e.g., number of layers, type of layers, ordering of layers, connections between layers, hyperparameters for layers) may be retrieved, selected, constructed, or otherwise accessed.

The multispectral data are then input to the trained neural network, generating higher resolution multispectral data, spectral bin images, and/or composite images, as indicated at step 316. In this way, higher resolution multispectral data, spectral bin images, and/or composite images can be obtained, despite the lower spatial resolution of multispectral imaging techniques.

The higher resolution multispectral data, spectral bin images, and/or composite images generated by inputting the multispectral data to the trained neural network can then be displayed to a user, stored for later use or further processing, or both, as indicated at step 318.

Figure 4:
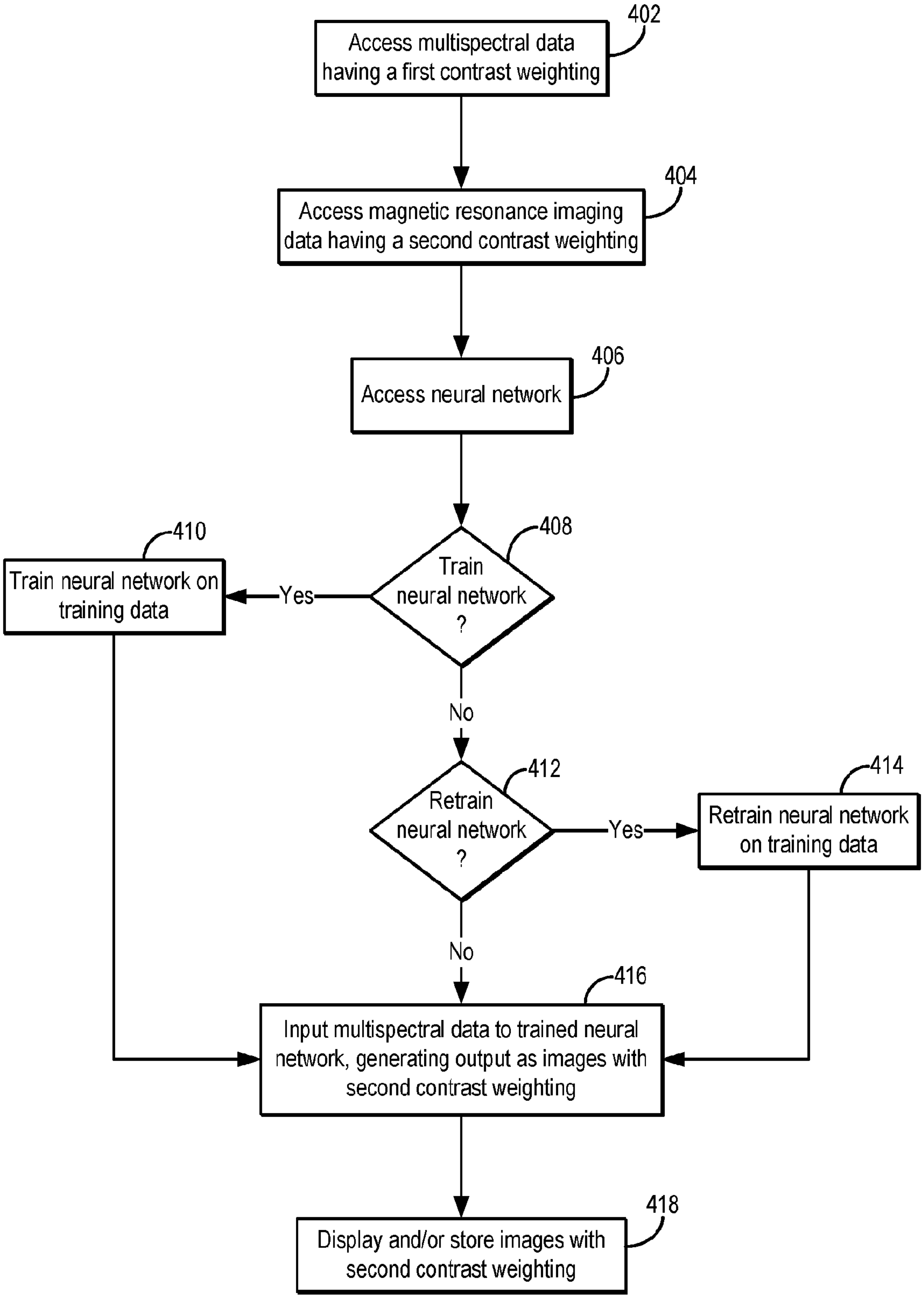
FIG. 4 is a flowchart setting forth the steps of an example method for generating enhanced multispectral data from multispectral data acquired from a metal-containing region with a first contrast weighting, where the enhanced multispectral data include images depicting the metal-containing region with a different contrast weighting than the multispectral data.

Referring now to FIG. 4, a flowchart is illustrated as setting forth the steps of an example method for generating images in a metal-containing region by transforming the contrast weighting of multispectral data from a first contrast weighting to a second contrast weighting using a suitably trained neural network or other machine learning algorithm. As will be described, the neural network or other machine learning algorithm takes multispectral data as input data and generates images with the second contrast weighting as output data.

The method includes accessing multispectral data with a computer system, as indicated at step 402. Accessing the multispectral data may include retrieving such data from a memory or other suitable data storage device or medium. Additionally or alternatively, accessing the multispectral data may include acquiring such data with an MRI system and transferring or otherwise communicating the data to the computer system, which may be a part of the MRI system. Likewise, in some example implementations, magnetic resonance imaging data (e.g., standard anatomical imaging data) can be accessed with the computer system, as indicated at step 404. Accessing the magnetic resonance imaging data can include retrieving previously acquired data from a memory or other data storage medium or device. Additionally or alternatively, accessing the data can include acquiring magnetic resonance imaging data with an MRI system and providing the data to the computer system, which may be a part of the MRI system.

The magnetic resonance imaging data may include images acquired within the same examination as the multispectral data. For example, the multispectral data and magnetic resonance imaging data may be acquired from an imaging volume in the subject. The multispectral data may be acquired from a first region in the imaging volume, where the first region contains a metallic object. The magnetic resonance imaging data may be acquired from a second region in the imaging volume, where the second region does not contain a metallic object. The first region and the second region may be at least partially overlapping in an overlap region.

In general, the multispectral data are acquired with a first contrast weighting and the magnetic resonance imaging data are acquired with a second contrast weighting that is different from the first contrast weighting. As a non-limiting example, the second contrast weighting may include T1-weighting, T2-weighting, inversion recovery weighting (e.g., STIR, FLAIR), vascular contrast weighting, diffusion weighting, perfusion weighting, and so on.

A neural network (or other suitable machine learning algorithm) is then accessed with the computer system, as indicated at step 406. In general, the neural network is trained, or has been trained, on training data in order to generate images with the second contrast weighting from multispectral data having the first contrast weighting.

When the accessed neural network has yet to be trained, it may be trained on training data, as indicated by decision block 408 and step 410. The training data may be formed from multispectral data and magnetic resonance imaging data acquired from an overlap region (e.g., an overlap between a first region containing a metallic object and a second region not containing a metallic object, as described above). In other examples, when the accessed neural network is a pretrained neural network, it may be retrained on training data, as indicated by decision block 412 and step 414. Again, the training data may be formed from multispectral data and magnetic resonance imaging data acquired from the overlap region. In still other examples, the neural network may be a pretrained neural network that is not retrained or updated.

Accessing a pretrained neural network may include accessing network parameters (e.g., weights, biases, or both) that have been optimized or otherwise estimated by training the neural network on training data. In some instances, retrieving the neural network can also include retrieving, constructing, or otherwise accessing the particular neural network architecture to be implemented. For instance, data pertaining to the layers in the neural network architecture (e.g., number of layers, type of layers, ordering of layers, connections between layers, hyperparameters for layers) may be retrieved, selected, constructed, or otherwise accessed.

The multispectral data are then input to the trained neural network, generating images of the first region with the second contrast weighting, as indicated at step 416. In this way, images with the second contrast weighting, which otherwise would be obscured by metal-induced artifacts, can be obtained of the first region (i.e., the region containing a metallic object).

The images of the first region with the second contrast weighting generated by inputting the multispectral data to the trained neural network can then be displayed to a user, stored for later use or further processing, or both, as indicated at step 418.

In an example study, the systems and methods described in the present disclosure were implemented to generate enhanced multispectral data as higher resolution multispectral images. In this example, the deep learning models described in the present disclosure were implemented to enhance the image quality of isotropic 3D multispectral metal artifact suppressed images. Conventional high resolution 2D fast/turbo spin echo images were used as network training labels by masking regions corrupted by metal artifacts. A pilot set of three cases deploying the presented concept to T2-weighted imaging of the instrumented spine were analyzed. The quantitative results of the analysis demonstrated improved spinal cord contrast, image resolution, and general agreement with 2D-FSE images when the deep learning enhancement model was inferred on the complete 3D-MSI datasets.

The quality of isotropic 3D-MSI acquisitions was enhanced using the deep learning-based techniques described in the present disclosure. Typically, 3D-MSI acquisitions have superior through-plane resolution, but lack the in-plane resolution of conventional 2D-FSE images. As described above, in this example, the 2D-FSE images that are typically acquired in addition to 3D-MSI were leveraged to enhance the 3D-MSI data. The 2D-FSE images provide higher quality assessments in regions not contaminated by metal artifacts. By automatically identifying regions where the 2D-FSE image are not contaminated, they can be used as a deep learning training labels to construct inferencing models to globally improve the quality of 3D-MSI.

Thus, as part of the approach for 2D-FSE-informed enhancement of 3D-MSI, regions where the 2D-FSE can be used as targets (or labels) of desired 3D-MSI contrast were identified. In this example, the 2D-FSE and 3D-MSI images had similar contrast, where the 2D-FSE resolution and contrast are more desirable than that of the 3D-MSI.

After resampling and registration of 3D-MSI to the 2D-FSE reference images, a local structural similarity image metric ("SSIM") map was constructed. This was accomplished by downsampling both image pairs to a common resolution and computing SSIMs across overlapping patches. For example, 32×32 patches over a 512×512 in-plane target matrix (with 50% overlap) were utilized for the present demonstration. This local SSIM map was thresholded to create a mask of regions where the two images nominally matched one another at a low resolution baseline.

A 2D convolutional neural net ("CNN") was utilized for the deep learning model. The CNN was customized to include the removal of upscaling and subpixel convolutions, and the use of parametric rectified linear unit ("PReLU") activations, 64 latent channels, and a kernel size of 5. The Adam optimizer was used with a mean-squared error loss function across 500 epochs.

A feasibility study was performed in order improve the quality of 3D-MSI being utilized within a broader study of instrumented treatment of spinal cord degeneration and injury. For the pilot analysis, data from three subjects with instrumented spinal fusion treatment of degenerative cervical myelopathy were analyzed.

T2-weighted 3D-MSI were acquired with 1.2 mm isotropic resolution with TE=60 ms and TR=2.5 s. Sagittal 2D-FSE images (TE=106 ms, TR=3 s) were acquired with 15 3 mm slices and 0.4×0.6 mm in-plane resolution, which was zero-filled to 0.3×0.3 resolution. 3D-MSI were resampled to the 2D-FSE spatial domain using Advanced Normalization Tools (ANTs) software.

After training and inferencing of the enhanced 3D-MSI, SSIM of the masked input and predicted slices were computed against the masked 2D-FSE training slices. In addition, several demonstrative profiles were extracted from the images to examine the spinal cord contrast, image resolution, and spinal cord lesion conspicuity enabled by the enhancement process.

Figure 5:
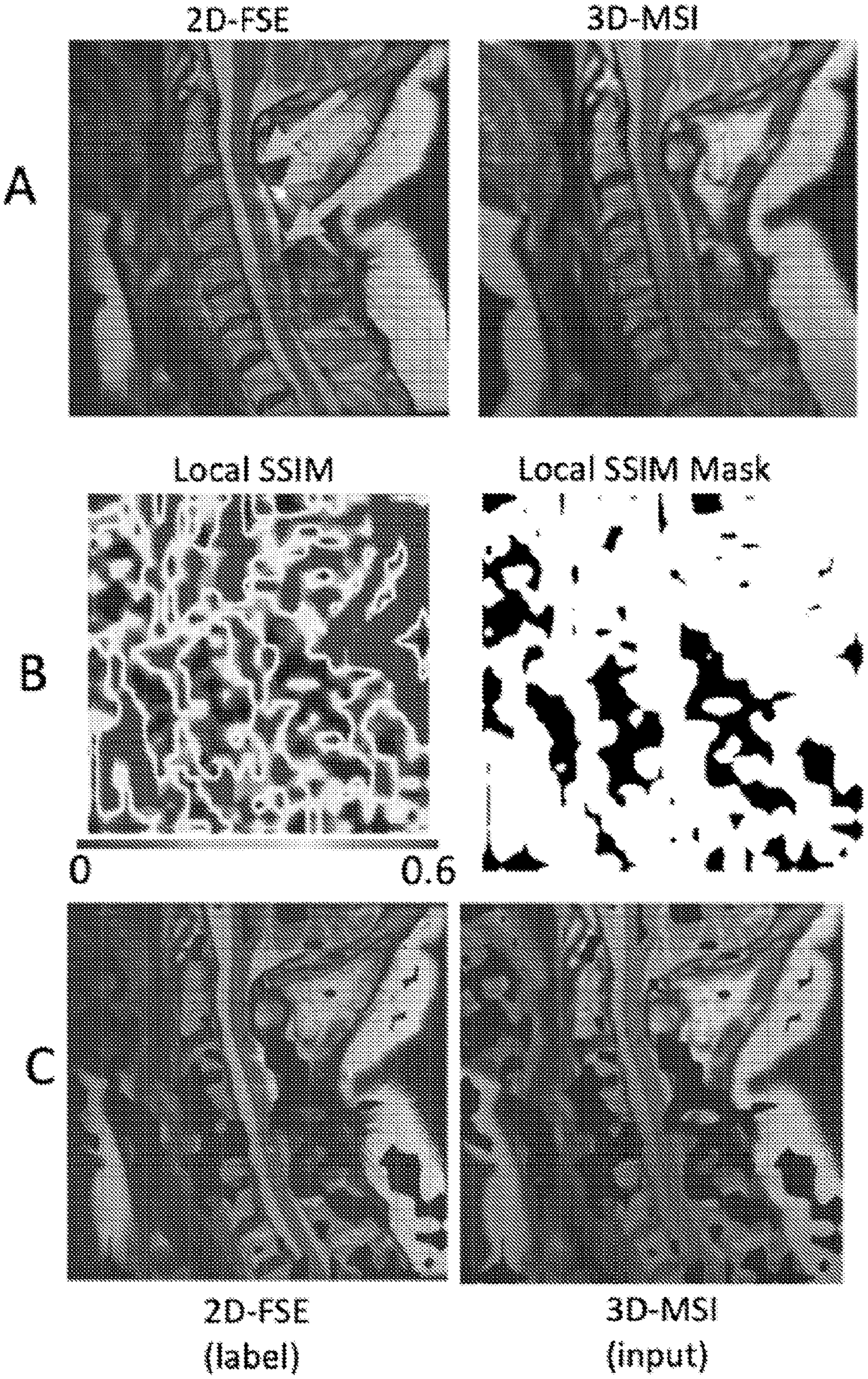
FIG. 5 shows example images and maps outlining a data curation process from an example study. (A) T2w 2D-FSE and resampled isotropic T2w 3D-MSI matching 2D-FSE coverage of an instrumented spinal fusion case. Note the 3D-MSI mitigation of metal artifacts in 2D-FSE (arrows), which comes at the expense of image resolution and image contrast (i.e. spinal cord). Local SSIM maps and masks (B), along with the masked training data (C) utilized to construct the 3D-MSI enhancement CNN. Note the masking of artifacted areas in the 2D-FSE images.
Figure 6:
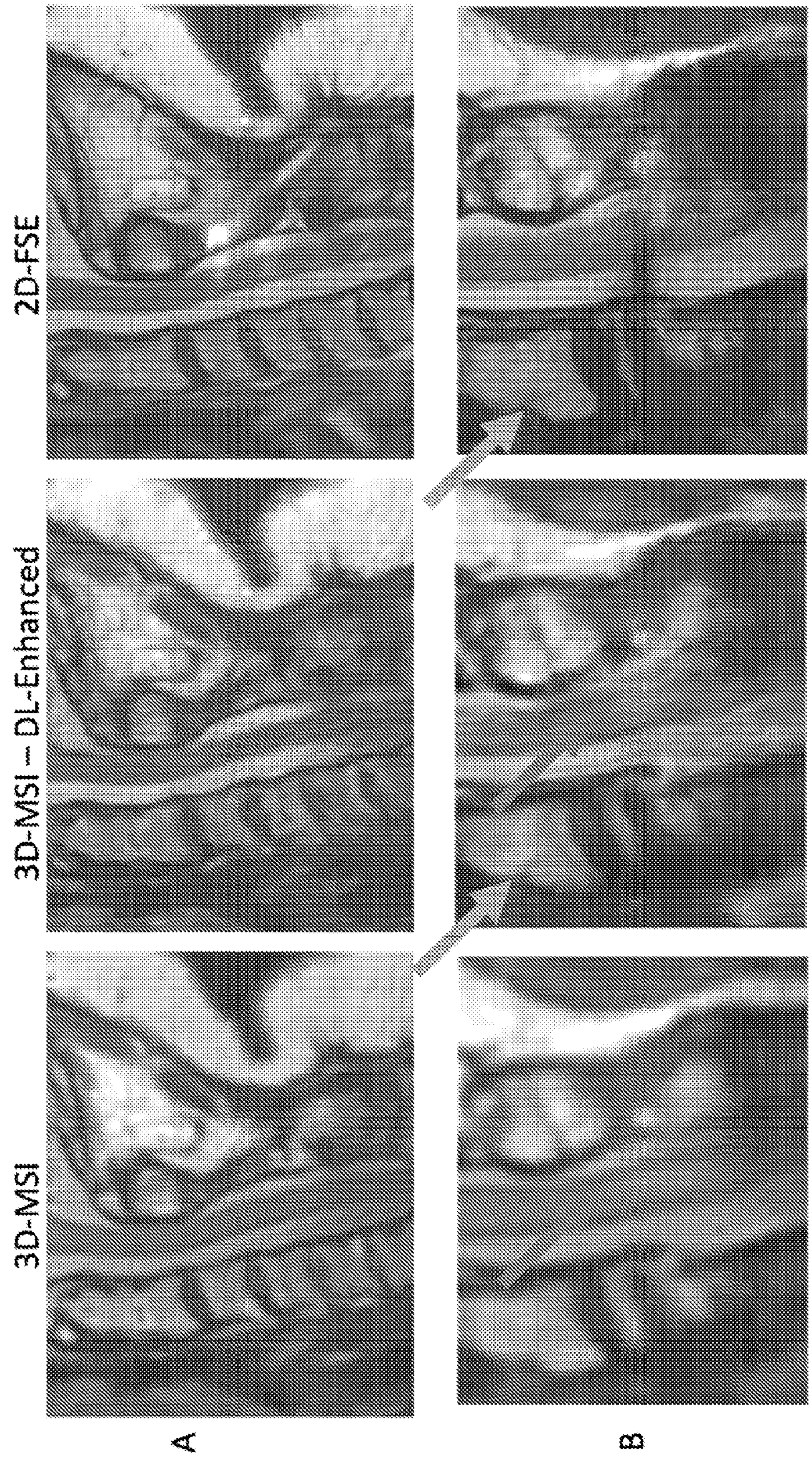
FIG. 6 shows example images demonstrating the capabilities of the systems and methods described in the present disclosure to generate enhanced multispectral data. Native 3D-MSI, DL-Enhanced 3D-MSI inferenced using the 2D CNN, and 2D-FSE reference/training images for 2 subjects in rows (A) and (B). Blue arrows indicate a region of elevated cord signal which is only slightly visible in the native 3D-MSI, but becomes substantially sharper and more prominent in the DL-Enhanced 3D-MSI. This area of elevated cord signal is obscured by artifact in the 2D-FSE image. Orange arrows point to a subtle feature within the vertebral body of the 2D-FSE that is washed out in the native 3D-MSI, but revealed in the DL-Enhanced 3D-MSI.
Figure 7:
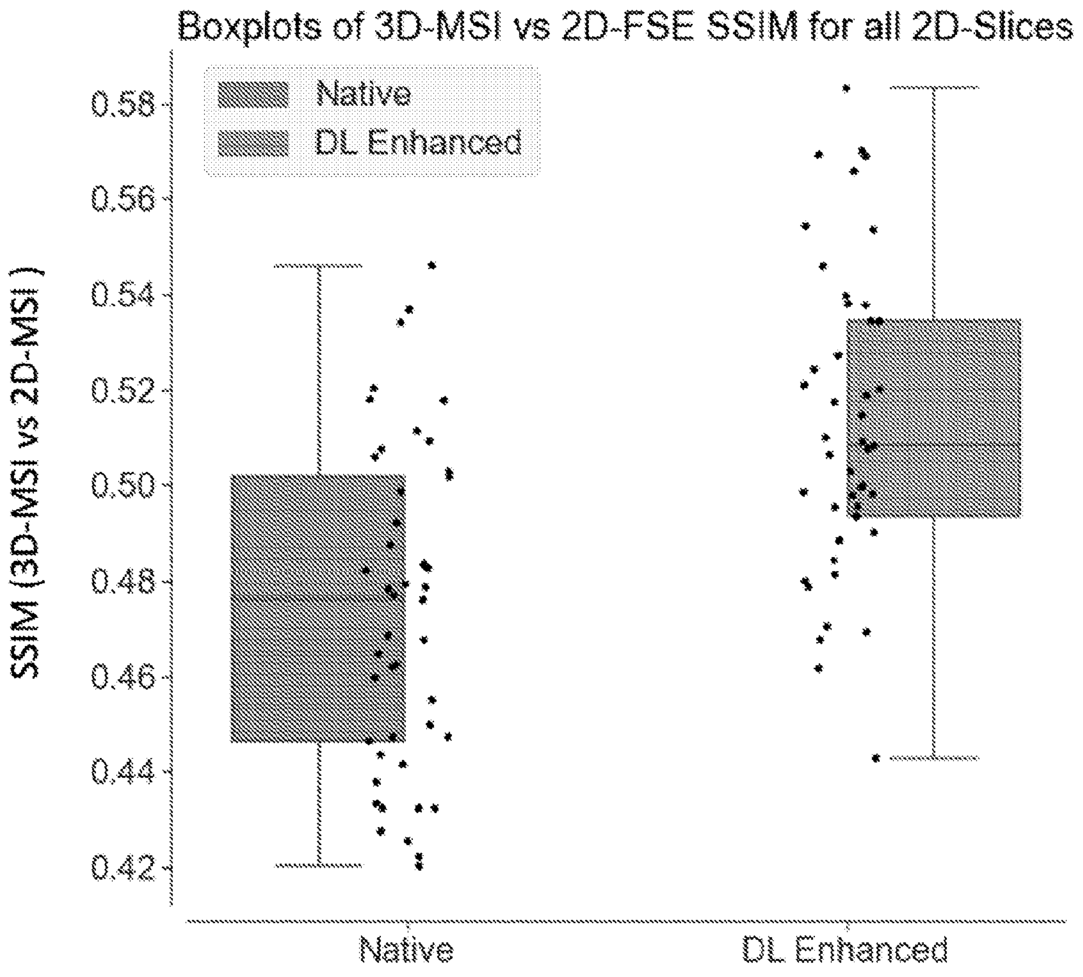
FIG. 7 shows box and scatter plots of SSIM measures comparing the native and enhanced 3D-MSI images against 2D-FSE images from an example study. The enhanced images had an average of 8.5% improvement in SSIM relative to the native 3D-MSI. The displayed SSIM distributions showed highly significant differences in medians ($p<0.0001$ via Mann-Whitney U Test)
Figure 8:
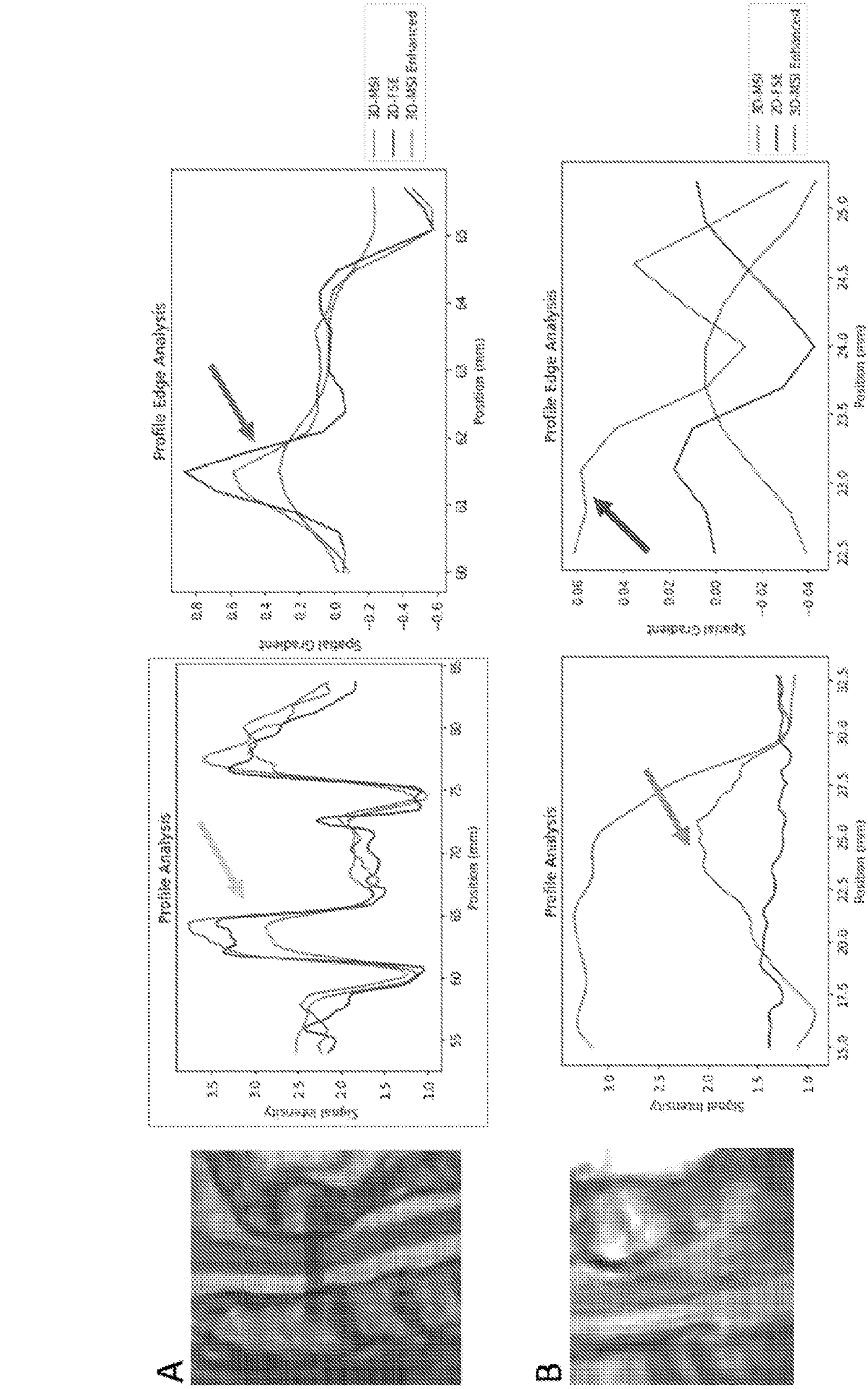
FIG. 8 shows image trace profiles illustrating the impact of the 3D-MSI enhancements on cord contrast, resolution, and cord lesion conspicuity. (A) transverse plot showing substantial improvement in spinal cord contrast using the enhancement CNN (orange arrow). In addition, the local gradient at the cord/CSF transition (blue arrow) is substantially improved (by over 50%) relative to the 2D-FSE benchmark. (B) Longitudinal profile through a hyperintense lesion within the cord, showing improved conspicuity within the enhanced 3D-MSI (green arrow). The 2D-FSE image in this region was artifacted and did not indicate reveal the lesion in this profile. The edge profile of this lesion was also highest on the enhanced 3D-MSI (purple arrow).

FIG. 5 provides representative images and maps outlining the data curation process. Row c) provides exemplary images that were input into the CNN training algorithm. FIG. 6 demonstrates the capabilities of this preliminary enhancement concept. The cord contrast and image resolution improvements are clearly evident in the displayed images. Row B) demonstrates the potential clinical utility of this enhancement algorithm, where a cord hyperintensity lesion is completely obscured by artifact in the 2D-FSE images, only mildly visible in the sub-par contrast of the original 3D-MSI, but is sharply visible in the enhanced 3D-MSI. FIG. 7 provides graphical evidence of the SSIM improvements gained by the enhancement algorithm against the target 2D-FSE images. The scale of the SSIM is not high, but the enhancement process makes a highly statistically significant ($p<0.0001$) advance in moving the 3D-MSI closer to the 2D-FSE image target. The measured SSIM improvement across the test data was 8.3+/3.0%. FIG. 8 utilizes image trace profiles (indicated in image overlays) to illustrate the impact of the 3D-MSI enhancements on cord contrast, resolution, and cord lesion conspicuity.

This study demonstrated a promising feasibility of utilizing 2D-FSE images as label targets for deep-learning enhancement of 3D-MSI. The challenges posed by suppressing metal artifacts are substantial and 3D-MSI struggles to match the quality of imaging methods that do not attempt to suppress these artifacts. The systems and methods described in the present application offer a solution whereby conventional images, which provide superior image quality away from metal implants, can be used to improve the image quality of 3D-MSI near metal interfaces.

In another example study, the systems and methods described in the present disclosure were implemented to generate images from a metal-containing region with an image contrast transferred from images acquired outside of the metal-containing region.

Techniques for acquiring magnetic resonance images around metallic hardware have been developed and widely used for orthopedic applications. Extension of these techniques to other clinical applications, however, have been sparse. One cause of this has been the lacking availability of relevant contrasts for non-orthopedic applications. Imaging techniques that offer more diverse contrasts, however, would enable the extension of multispectral imaging to neuroimaging applications where implanted devices including flow diverters, shunts, aneurysm coils and clips, skull caps, and cochlear implants cause significant artifacts from polarizing field disturbances.

In an example study, a workflow for contrast transforms in multispectral acquisitions was implemented using the systems and methods described in the present disclosure. This workflow was demonstrated in a technique for angiographic imaging. In short, flow voids in the fast spin echo multispectral acquisition were used with the concepts of fast blood imaging to achieve negative vascular contrast. Then, a deep neural network, trained and validated on a per-exam basis, was used to further highlight vasculature with a contrast similar to standard time of flight techniques.

A human research participant was imaged on a 3.0 T MRI system with a 3D multispectral acquisition technique to achieve T1, T2, and proton density weighted images (T1: TR/TE 900/8.5 ms, echo train length 12; T2: TR/TE 5000/78.1 ms, echo train length 40; PD: TR/TE 3500, 28.5 ms, echo train length 30; all FOV 25.6 cm, matrix 256×256, slice thickness 4 mm, refocus flip 85 degrees), and with a standard time of flight (TOF) acquisition (TR/TE 24.0/3.4 ms, flip angle 15 degrees, FOV 20.0 cm, matrix 400×400, slice thickness 1.0 mm).

A ferroshim chip was placed at the approximate relative location of a cochlear implant magnet, affixed to the 48-channel head coil, and separated from the participant with a dielectric pad. This arrangement safely yielded a significant disruption in the polarizing field homogeneity, and simulated the artifact arising from NMI-conditional cochlear implant magnets, which are known to yield signal voids covering up to half of a patient's brain.

Figure 9:
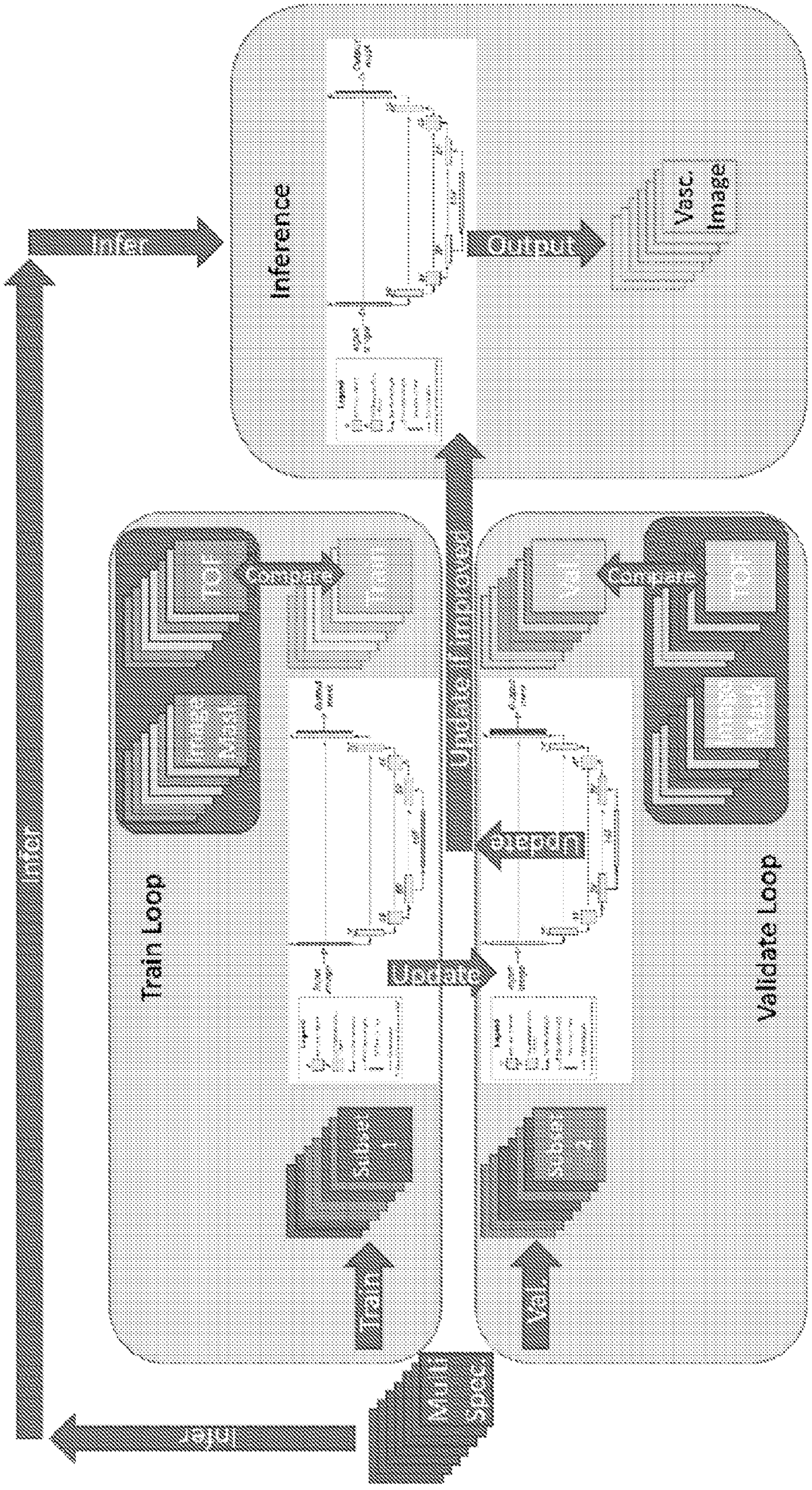
FIG. 9 illustrates an example neural network training workflow for training a neural network to generate enhanced multispectral data as contrast-transformed multispectral data in accordance with some examples described in the present disclosure.

Following acquisition and registration across acquired contrasts, a subject-specific U-Net was trained to highlight the vasculature. The U-Net (4 encoder/decoder blocks—64, 128, 256, 512 filters—and a 1024 filter bottleneck) received the multi-contrast multispectral images (with augmentation of left-right, anterior-posterior, shift, scale, rotate, piecewise affine, grid distortion, and optical distortion applied on a subset of images in each training epoch) as inputs and was trained to predict a thresholded version of the TOF acquisition with training masked to artifact free regions of the TOF acquisition. Slices of the volumes were randomly split into train and validation datasets, and, following 100 epochs of training wherein the soft margin loss function was evaluated within a mask of artifact-free regions of the TOF acquisition, the model with best performance on the validation dataset was used to infer a vascular image from the full set of acquired multispectral data—including in the region of signal loss of the TOF angiographic image. FIG. 9 illustrates an example workflow of the training process used to train the neural network model.

Figure 10:
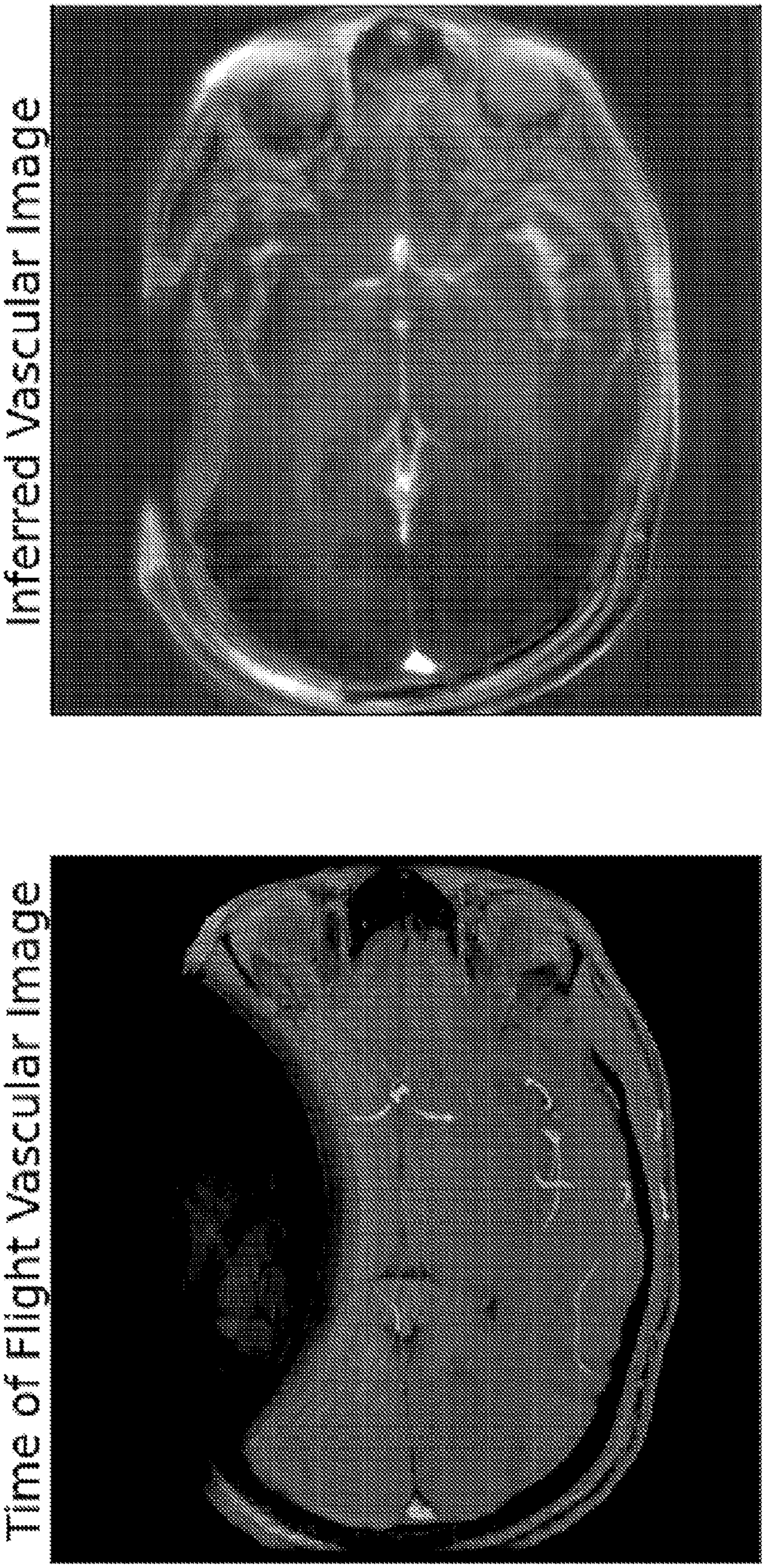
FIG. 10 illustrates an example time-of-flight vasculature image acquired from a metal-containing region (left) and an inferred vasculature image of the metal-containing region (right) generated by inputting multispectral data to a neural network trained to generate enhanced multispectral data as contrast-transformed multispectral data.
Figure 11:
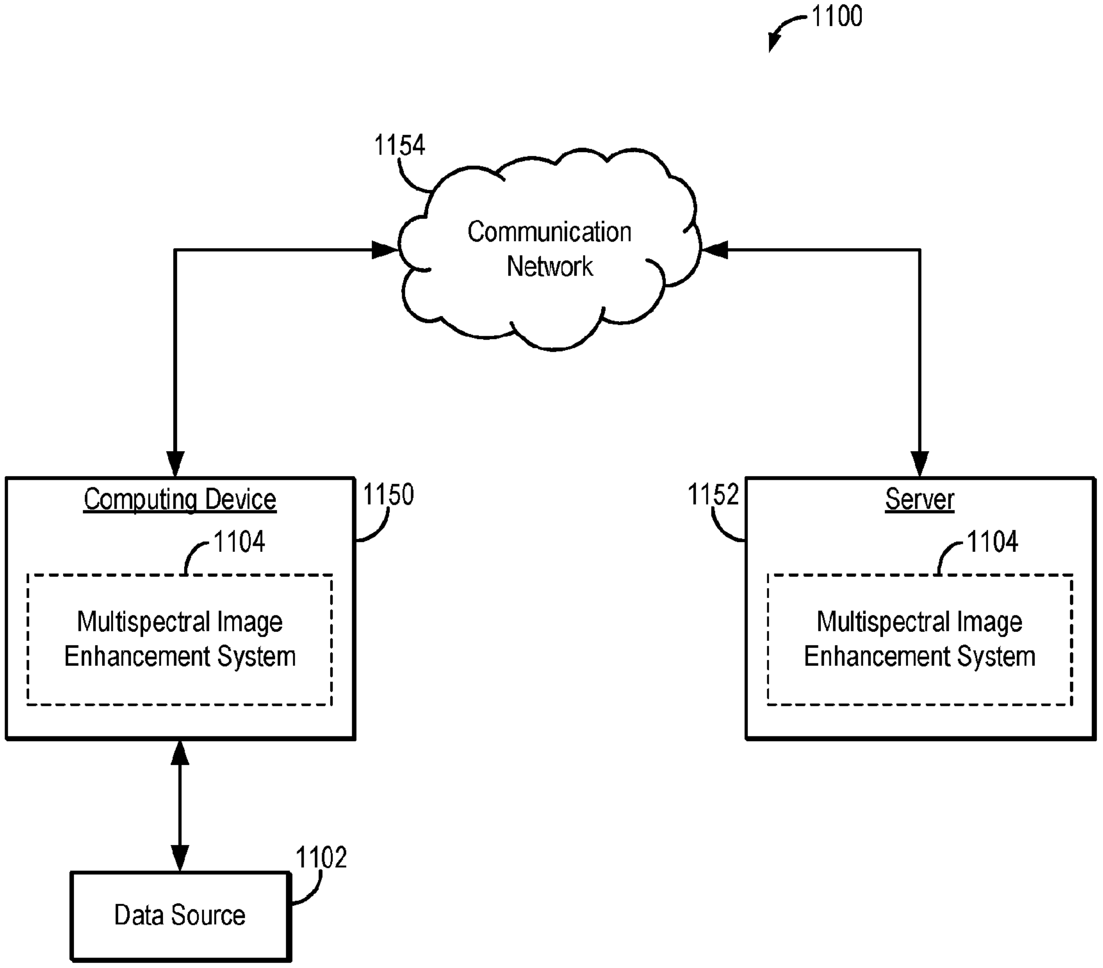
FIG. 11 is a block diagram of an example system for improving the spatial resolution of multispectral data and/or images.
Figure 12:
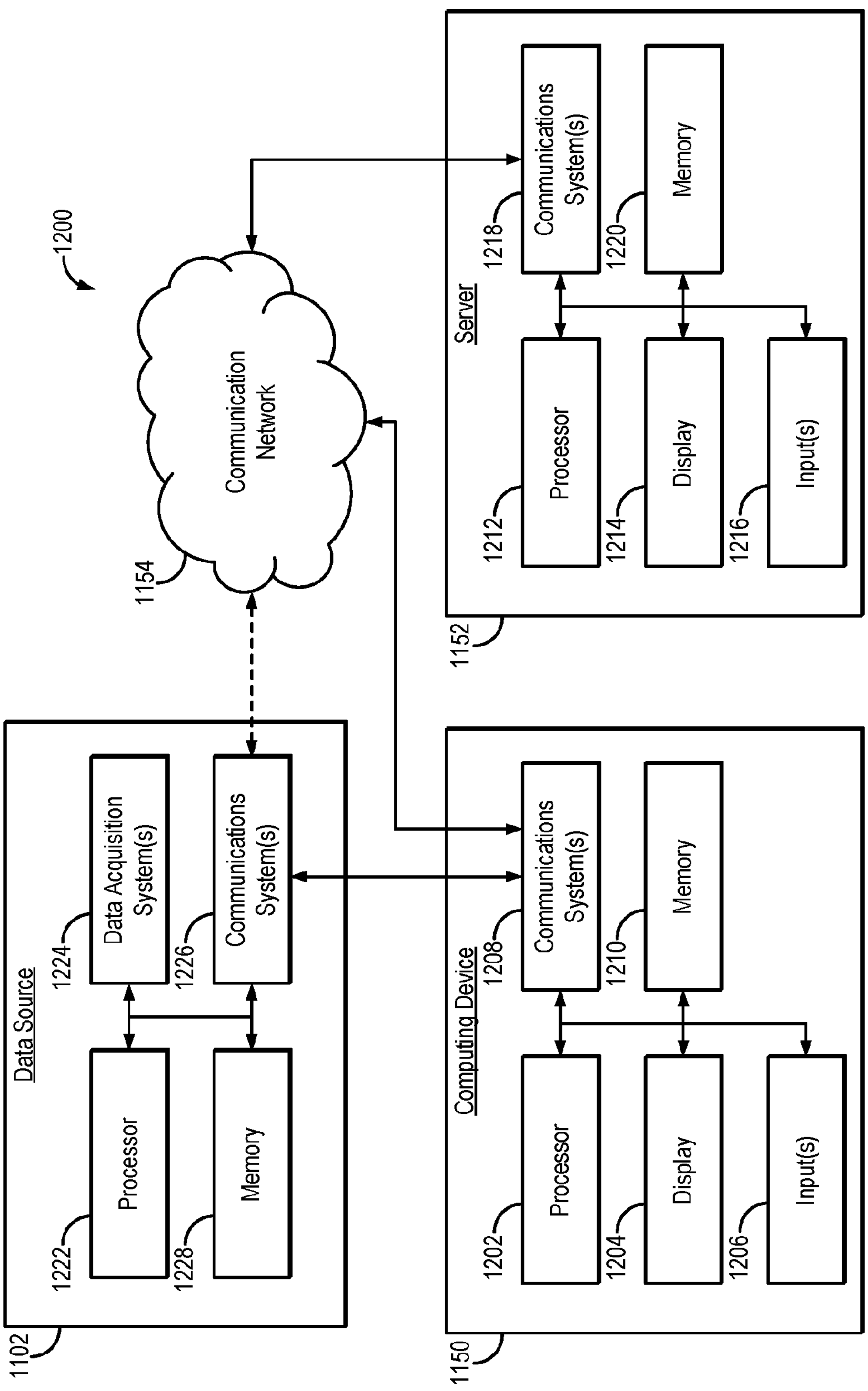
FIG. 12 is a block diagram of example components that can implement the system of FIG. 11.
Figure 13:
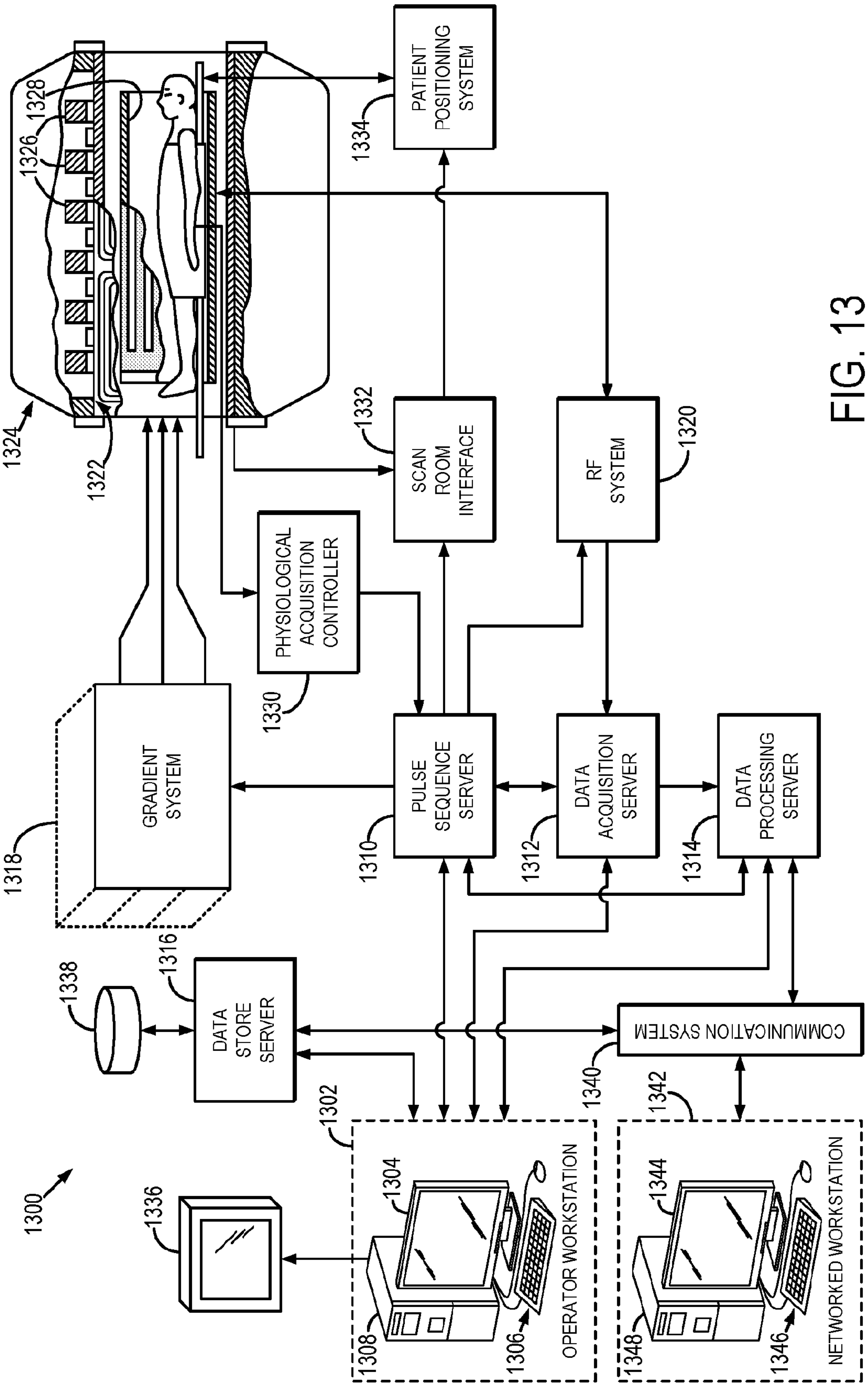
FIG. 13 is a block diagram of an example MRI system that can implement the methods described in the present disclosure.

FIG. 10 shows axial acquired time of flight and multispectral-inferred vascular images in a human participant at the level of the M2 component of the middle cerebral artery. While the right middle cerebral artery is visible in the time of flight acquisition, field inhomogeneity significantly disrupts the spatial encoding of the acquisition on the left half of the brain. Conversely, the multispectral-inferred vascular image shows recovered vascular signal in both the left and right middle cerebral arteries.

Imaging in the presence of metallic implants presents a unique opportunity for patient-specific image inference optimizations. In such cases, standard, high-resolution acquisitions are often performed to achieve high-quality images in regions distant from the implant while multi-spectral acquisitions are acquired to achieve lower resolution diagnostic images in the region of the implant. As such, there are overlapping regions which are imaged with both standard high-resolution and lower resolution multispectral techniques. This allows for the patient-specific training of deep learning models to enhance multi-spectral images where training occurs in regions of artifact-free image overlap. By randomly splitting the acquired volume into train and validation sets, an early stopping criteria addresses concern of over-fitting.

In this case, vascular contrast, similar to time of flight angiography, was inferred from standard multispectral images wherein vascular contrast is observed with flow voids. The inferred vascular image had lower resolution than the standard time of flight acquisition, but achieved bright vessel contrast in the left middle cerebral artery, which was fully obscured by artifact in the TOF acquisition.

FIG. 6 shows an example of a system 600 for enhancing multispectral data in accordance with some examples of the systems and methods described in the present disclosure. As shown in FIG. 6, a computing device 650 can receive one or more types of data (e.g., multispectral data, magnetic resonance imaging data) from data source 602. In some embodiments, computing device 650 can execute at least a portion of a multispectral image enhancement system 604 to enhance multispectral data received from the data source 602.

Additionally or alternatively, in some embodiments, the computing device 650 can communicate information about data received from the data source 602 to a server 652 over a communication network 654, which can execute at least a portion of the multispectral image enhancement system 604. In such embodiments, the server 652 can return information to the computing device 650 (and/or any other suitable computing device) indicative of an output of the multispectral image enhancement system 604.

In some embodiments, computing device 650 and/or server 652 can be any suitable computing device or combination of devices, such as a desktop computer, a laptop computer, a smartphone, a tablet computer, a wearable computer, a server computer, a virtual machine being executed by a physical computing device, and so on. The computing device 650 and/or server 652 can also reconstruct images from the data.

In some embodiments, data source 602 can be any suitable source of data (e.g., measurement data, images reconstructed from measurement data, processed image data), such as an MRI system, another computing device (e.g., a server storing measurement data, images reconstructed from measurement data, processed image data), and so on. In some embodiments, data source 602 can be local to computing device 650. For example, data source 602 can be incorporated with computing device 650 (e.g., computing device 650 can be configured as part of a device for measuring, recording, estimating, acquiring, or otherwise collecting or storing data). As another example, data source 602 can be connected to computing device 650 by a cable, a direct wireless link, and so on. Additionally or alternatively, in some embodiments, data source 602 can be located locally and/or remotely from computing device 650, and can communicate data to computing device 650 (and/or server 652) via a communication network (e.g., communication network 654).

In some embodiments, communication network 654 can be any suitable communication network or combination of communication networks. For example, communication network 654 can include a Wi-Fi network (which can include one or more wireless routers, one or more switches, etc.), a peer-to-peer network (e.g., a Bluetooth network), a cellular network (e.g., a 3G network, a 4G network, etc., complying with any suitable standard, such as CDMA, GSM, LTE, LTE Advanced, WiMAX, etc.), other types of wireless network, a wired network, and so on. In some embodiments, communication network 654 can be a local area network, a wide area network, a public network (e.g., the Internet), a private or semi-private network (e.g., a corporate or university intranet), any other suitable type of network, or any suitable combination of networks. Communications links shown in FIG. 6 can each be any suitable communications link or combination of communications links, such as wired links, fiber optic links, Wi-Fi links, Bluetooth links, cellular links, and so on.

Referring now to FIG. 7, an example of hardware 700 that can be used to implement data source 602, computing device 650, and server 652 in accordance with some embodiments of the systems and methods described in the present disclosure is shown.

As shown in FIG. 7, in some embodiments, computing device 650 can include a processor 702, a display 704, one or more inputs 706, one or more communication systems 708, and/or memory 710. In some embodiments, processor 702 can be any suitable hardware processor or combination of processors, such as a central processing unit ("CPU"), a graphics processing unit ("GPU"), and so on. In some embodiments, display 704 can include any suitable display devices, such as a liquid crystal display ("LCD") screen, a light-emitting diode ("LED") display, an organic LED ("OLED") display, an electrophoretic display (e.g., an "e-ink" display), a computer monitor, a touchscreen, a television, and so on. In some embodiments, inputs 706 can include any suitable input devices and/or sensors that can be used to receive user input, such as a keyboard, a mouse, a touchscreen, a microphone, and so on.

In some embodiments, communications systems 708 can include any suitable hardware, firmware, and/or software for communicating information over communication network 654 and/or any other suitable communication networks. For example, communications systems 708 can include one or more transceivers, one or more communication chips and/or chip sets, and so on. In a more particular example, communications systems 708 can include hardware, firmware, and/or software that can be used to establish a Wi-Fi connection, a Bluetooth connection, a cellular connection, an Ethernet connection, and so on.

In some embodiments, memory 710 can include any suitable storage device or devices that can be used to store instructions, values, data, or the like, that can be used, for example, by processor 702 to present content using display 704, to communicate with server 652 via communications system(s) 708, and so on. Memory 710 can include any suitable volatile memory, non-volatile memory, storage, or any suitable combination thereof. For example, memory 710 can include random-access memory ("RAM"), read-only memory ("ROM"), electrically programmable ROM ("EPROM"), electrically erasable ROM ("EEPROM"), other forms of volatile memory, other forms of non-volatile memory, one or more forms of semi-volatile memory, one or more flash drives, one or more hard disks, one or more solid state drives, one or more optical drives, and so on. In some embodiments, memory 710 can have encoded thereon, or otherwise stored therein, a computer program for controlling operation of computing device 650. In such embodiments, processor 702 can execute at least a portion of the computer program to present content (e.g., images, user interfaces, graphics, tables), receive content from server 652, transmit information to server 652, and so on. For example, the processor 702 and the memory 710 can be configured to perform the methods described herein (e.g., the method of FIG. 1, the method of FIG. 2, the method of FIG. 3, the method of FIG. 4, the training workflow of FIG. 9).

In some embodiments, server 652 can include a processor 712, a display 714, one or more inputs 716, one or more communications systems 718, and/or memory 720. In some embodiments, processor 712 can be any suitable hardware processor or combination of processors, such as a CPU, a GPU, and so on. In some embodiments, display 714 can include any suitable display devices, such as an LCD screen, LED display, OLED display, electrophoretic display, a computer monitor, a touchscreen, a television, and so on. In some embodiments, inputs 716 can include any suitable input devices and/or sensors that can be used to receive user input, such as a keyboard, a mouse, a touchscreen, a microphone, and so on.

In some embodiments, communications systems 718 can include any suitable hardware, firmware, and/or software for communicating information over communication network 654 and/or any other suitable communication networks. For example, communications systems 718 can include one or more transceivers, one or more communication chips and/or chip sets, and so on. In a more particular example, communications systems 718 can include hardware, firmware, and/or software that can be used to establish a Wi-Fi connection, a Bluetooth connection, a cellular connection, an Ethernet connection, and so on.

In some embodiments, memory 720 can include any suitable storage device or devices that can be used to store instructions, values, data, or the like, that can be used, for example, by processor 712 to present content using display 714, to communicate with one or more computing devices 650, and so on. Memory 720 can include any suitable volatile memory, non-volatile memory, storage, or any suitable combination thereof. For example, memory 720 can include RAM, ROM, EPROM, EEPROM, other types of volatile memory, other types of non-volatile memory, one or more types of semi-volatile memory, one or more flash drives, one or more hard disks, one or more solid state drives, one or more optical drives, and so on. In some embodiments, memory 720 can have encoded thereon a server program for controlling operation of server 652. In such embodiments, processor 712 can execute at least a portion of the server program to transmit information and/or content (e.g., data, images, a user interface) to one or more computing devices 650, receive information and/or content from one or more computing devices 650, receive instructions from one or more devices (e.g., a personal computer, a laptop computer, a tablet computer, a smartphone), and so on.

In some embodiments, the server 652 is configured to perform the methods described in the present disclosure. For example, the processor 712 and memory 720 can be configured to perform the methods described herein (e.g., the method of FIG. 1, the method of FIG. 2, the method of FIG. 3, the method of FIG. 4, the training workflow of FIG. 9).

In some embodiments, data source 602 can include a processor 722, one or more data acquisition systems 724, one or more communications systems 726, and/or memory 728. In some embodiments, processor 722 can be any suitable hardware processor or combination of processors, such as a CPU, a GPU, and so on. In some embodiments, the one or more data acquisition systems 724 are generally configured to acquire data, images, or both, and can include an MRI system. Additionally or alternatively, in some embodiments, the one or more data acquisition systems 724 can include any suitable hardware, firmware, and/or software for coupling to and/or controlling operations of an MRI system. In some embodiments, one or more portions of the data acquisition system(s) 724 can be removable and/or replaceable.

Note that, although not shown, data source 602 can include any suitable inputs and/or outputs. For example, data source 602 can include input devices and/or sensors that can be used to receive user input, such as a keyboard, a mouse, a touchscreen, a microphone, a trackpad, a trackball, and so on. As another example, data source 602 can include any suitable display devices, such as an LCD screen, an LED display, an OLED display, an electrophoretic display, a computer monitor, a touchscreen, a television, etc., one or more speakers, and so on.

In some embodiments, communications systems 726 can include any suitable hardware, firmware, and/or software for communicating information to computing device 650 (and, in some embodiments, over communication network 654 and/or any other suitable communication networks). For example, communications systems 726 can include one or more transceivers, one or more communication chips and/or chip sets, and so on. In a more particular example, communications systems 726 can include hardware, firmware, and/or software that can be used to establish a wired connection using any suitable port and/or communication standard (e.g., VGA, DVI video, USB, RS-232, etc.), Wi-Fi connection, a Bluetooth connection, a cellular connection, an Ethernet connection, and so on.

In some embodiments, memory 728 can include any suitable storage device or devices that can be used to store instructions, values, data, or the like, that can be used, for example, by processor 722 to control the one or more data acquisition systems 724, and/or receive data from the one or more data acquisition systems 724; to generate images from data; present content (e.g., data, images, a user interface) using a display; communicate with one or more computing devices 650; and so on. Memory 728 can include any suitable volatile memory, non-volatile memory, storage, or any suitable combination thereof. For example, memory 728 can include RAM, ROM, EPROM, EEPROM, other types of volatile memory, other types of non-volatile memory, one or more types of semi-volatile memory, one or more flash drives, one or more hard disks, one or more solid state drives, one or more optical drives, and so on. In some embodiments, memory 728 can have encoded thereon, or otherwise stored therein, a program for controlling operation of data source 602. In such embodiments, processor 722 can execute at least a portion of the program to generate images, transmit information and/or content (e.g., data, images, a user interface) to one or more computing devices 650, receive information and/or content from one or more computing devices 650, receive instructions from one or more devices (e.g., a personal computer, a laptop computer, a tablet computer, a smartphone, etc.), and so on.

In some embodiments, any suitable computer-readable media can be used for storing instructions for performing the functions and/or processes described herein. For example, in some embodiments, computer-readable media can be transitory or non-transitory. For example, non-transitory computer-readable media can include media such as magnetic media (e.g., hard disks, floppy disks), optical media (e.g., compact discs, digital video discs, Blu-ray discs), semiconductor media (e.g., RAM, flash memory, EPROM, EEPROM), any suitable media that is not fleeting or devoid of any semblance of permanence during transmission, and/or any suitable tangible media. As another example, transitory computer-readable media can include signals on networks, in wires, conductors, optical fibers, circuits, or any suitable media that is fleeting and devoid of any semblance of permanence during transmission, and/or any suitable intangible media.

As used herein in the context of computer implementation, unless otherwise specified or limited, the terms "component," "system," "module," "framework," and the like are intended to encompass part or all of computer-related systems that include hardware, software, a combination of hardware and software, or software in execution. For example, a component may be, but is not limited to being, a processor device, a process being executed (or executable) by a processor device, an object, an executable, a thread of execution, a computer program, or a computer. By way of illustration, both an application running on a computer and the computer can be a component. One or more components (or system, module, and so on) may reside within a process or thread of execution, may be localized on one computer, may be distributed between two or more computers or other processor devices, or may be included within another component (or system, module, and so on).

In some implementations, devices or systems disclosed herein can be utilized or installed using methods embodying aspects of the disclosure. Correspondingly, description herein of particular features, capabilities, or intended purposes of a device or system is generally intended to inherently include disclosure of a method of using such features for the intended purposes, a method of implementing such capabilities, and a method of installing disclosed (or otherwise known) components to support these purposes or capabilities. Similarly, unless otherwise indicated or limited, discussion herein of any method of manufacturing or using a particular device or system, including installing the device or system, is intended to inherently include disclosure, as embodiments of the disclosure, of the utilized features and implemented capabilities of such device or system.

Referring particularly now to FIG. 8, an example of an MRI system 800 that can implement the methods described here is illustrated. The MRI system 800 includes an operator workstation 802 that may include a display 804, one or more input devices 806 (e.g., a keyboard, a mouse), and a processor 808. The processor 808 may include a commercially available programmable machine running a commercially available operating system. The operator workstation 802 provides an operator interface that facilitates entering scan parameters into the MRI system 800. The operator workstation 802 may be coupled to different servers, including, for example, a pulse sequence server 810, a data acquisition server 812, a data processing server 814, and a data store server 816. The operator workstation 802 and the servers 810, 812, 814, and 816 may be connected via a communication system 840, which may include wired or wireless network connections.

The pulse sequence server 810 functions in response to instructions provided by the operator workstation 802 to operate a gradient system 818 and a radiofrequency ("RF") system 820. Gradient waveforms for performing a prescribed scan are produced and applied to the gradient system 818, which then excites gradient coils in an assembly 822 to produce the magnetic field gradients $G_x$, $G_y$, and $G_z$ that are used for spatially encoding magnetic resonance signals. The gradient coil assembly 822 forms part of a magnet assembly 824 that includes a polarizing magnet 826 and a whole-body RF coil 828.

RF waveforms are applied by the RF system 820 to the RF coil 828, or a separate local coil to perform the prescribed magnetic resonance pulse sequence. Responsive magnetic resonance signals detected by the RF coil 828, or a separate local coil, are received by the RF system 820. The responsive magnetic resonance signals may be amplified, demodulated, filtered, and digitized under direction of commands produced by the pulse sequence server 810. The RF system 820 includes an RF transmitter for producing a wide variety of RF pulses used in MRI pulse sequences. The RF transmitter is responsive to the prescribed scan and direction from the pulse sequence server 810 to produce RF pulses of the desired frequency, phase, and pulse amplitude waveform. The generated RF pulses may be applied to the whole-body RF coil 828 or to one or more local coils or coil arrays.

The RE system 820 also includes one or more RF receiver channels. An RF receiver channel includes an RF preamplifier that amplifies the magnetic resonance signal received by the coil 828 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2};$$

and the phase of the received magnetic resonance signal may also be determined according to the following relationship:

$$\varphi = \tan^{-1}\left(\frac{Q}{I}\right).$$

The pulse sequence server 810 may receive patient data from a physiological acquisition controller 830. By way of example, the physiological acquisition controller 830 may receive signals from a number of different sensors connected to the patient, including electrocardiograph ("ECG") signals from electrodes, or respiratory signals from a respiratory bellows or other respiratory monitoring devices. These signals may be used by the pulse sequence server 810 to synchronize, or "gate," the performance of the scan with the subject's heart beat or respiration.

The pulse sequence server 810 may also connect to a scan room interface circuit 832 that receives signals from various sensors associated with the condition of the patient and the magnet system. Through the scan room interface circuit 832, a patient positioning system 834 can receive commands to move the patient to desired positions during the scan.

The digitized magnetic resonance signal samples produced by the RF system 820 are received by the data acquisition server 812. The data acquisition server 812 operates in response to instructions downloaded from the operator workstation 802 to receive the real-time magnetic resonance data and provide buffer storage, so that data is not lost by data overrun. In some scans, the data acquisition server 812 passes the acquired magnetic resonance data to the data processor server 814. In scans that require information derived from acquired magnetic resonance data to control the further performance of the scan, the data acquisition server 812 may be programmed to produce such information and convey it to the pulse sequence server 810. For example, during pre-scans, magnetic resonance data may be acquired and used to calibrate the pulse sequence performed by the pulse sequence server 810. As another example, navigator signals may be acquired and used to adjust the operating parameters of the RF system 820 or the gradient system 818, or to control the view order in which k-space is sampled. In still another example, the data acquisition server 812 may also process magnetic resonance signals used to detect the arrival of a contrast agent in a magnetic resonance angiography ("MRA") scan. For example, the data acquisition server 812 may acquire magnetic resonance data and processes it in real-time to produce information that is used to control the scan.

The data processing server 814 receives magnetic resonance data from the data acquisition server 812 and processes the magnetic resonance data in accordance with instructions provided by the operator workstation 802. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 814 are conveyed back to the operator workstation 802 for storage. Real-time images may be stored in a data base memory cache, from which they may be output to operator display 802 or a display 836. Batch mode images or selected real time images may be stored in a host database on disc storage 838. When such images have been reconstructed and transferred to storage, the data processing server 814 may notify the data store server 816 on the operator workstation 802. The operator workstation 802 may be used by an operator to archive the images, produce films, or send the images via a network to other facilities.

The MRI system 800 may also include one or more networked workstations 842. For example, a networked workstation 842 may include a display 844, one or more input devices 846 (e.g., a keyboard, a mouse), and a processor 848. The networked workstation 842 may be located within the same facility as the operator workstation 802, or in a different facility, such as a different healthcare institution or clinic.

The networked workstation 842 may gain remote access to the data processing server 814 or data store server 816 via the communication system 840. Accordingly, multiple networked workstations 842 may have access to the data processing server 814 and the data store server 816. In this manner, magnetic resonance data, reconstructed images, or other data may be exchanged between the data processing server 814 or the data store server 816 and the networked workstations 842, such that the data or images may be remotely processed by a networked workstation 842.

The present disclosure has described one or more preferred embodiments, and it should be appreciated that many equivalents, alternatives, variations, and modifications, aside from those expressly stated, are possible and within the scope of the disclosure.

The invention claimed is:

1. A method for multispectral magnetic resonance imaging, the method comprising:

(a) accessing multispectral data with a computer system, wherein the multispectral data have been acquired from a first region in a subject using a magnetic resonance imaging (MRI) system, wherein first region contains a metal object;

(b) accessing magnetic resonance imaging data with the computer system, wherein the magnetic resonance imaging data have been acquired from a second region in the subject using the MRI system, wherein the second region does not contain the metal object and partially overlaps the first region in an overlap region;

(c) accessing a neural network with the computer system;

(d) training the neural network on training data using the computer system, wherein the training data comprise multispectral data acquired from the overlap region and magnetic resonance imaging data acquired from the overlap region, wherein the neural network is trained on the training data to generate enhanced multispectral data;

(e) inputting the multispectral data acquired from the first region to the neural network using the computer system, generating enhanced multispectral data depicting the first region as an output; and (f) outputting the enhanced multispectral data using the computer system.

2. A method for multispectral magnetic resonance imaging, the method comprising:

(a) accessing multispectral data with a computer system, wherein the multispectral data have been acquired from a first region in a subject at a first spatial resolution using a magnetic resonance imaging (MRI) system, wherein the first region contains a metal object;

(b) accessing magnetic resonance imaging data with the computer system, wherein the magnetic resonance imaging data have been acquired from a second region in the subject at a second spatial resolution using the MRI system, wherein the second region does not contain the metal object and the second spatial resolution is higher than the first spatial resolution;

(c) accessing a neural network with the computer system, wherein the neural network has been trained on training data including the magnetic resonance imaging data in order to increase spatial resolution of the multispectral data; and (d) generating a higher resolution multispectral data with the computer system by inputting the multispectral data to the neural network, generating an output as higher spatial resolution multispectral data having a spatial resolution higher than the first spatial resolution.

3. A method for multispectral magnetic resonance imaging, the method comprising:

(a) accessing multispectral data with a computer system, wherein the multispectral data have been acquired from a subject using a magnetic resonance imaging (MRI) system;

(b) accessing a neural network with the computer system, wherein the neural network has been trained on training data to increase spatial resolution when combining spectral bin images;

(c) reconstructing a set of spectral bin images from the multispectral data using the computer system; and (d) generating a composite image with the computer system by inputting the set of spectral bin images to the neural network, generating an output as the composite image, wherein a spatial resolution of the composite image is increased relative to the set of spectral bin images.

4. A method for training a neural network to generate enhanced multispectral data, the method comprising:

(a) accessing multispectral data with a computer system, wherein the multispectral data have been acquired from a first region in a subject using a magnetic resonance imaging (MRI) system, wherein first region contains a metal object;

(b) accessing magnetic resonance imaging data with the computer system, wherein the magnetic resonance imaging data have been acquired from a second region in the subject using the MRI system, wherein the second region does not contain the metal object and partially overlaps the first region in an overlap region;

(c) assembling training data from the multispectral data acquired from the overlap region and the magnetic resonance imaging data acquired from the overlap region; and (d) training a neural network on the training data using the computer system.

5. The method of claim 1, wherein the enhanced multispectral data have a different contrast weighting than the multispectral data.

6. The method of claim 1, wherein the enhanced multispectral data have a higher spatial resolution than the multispectral data.

7. The method of claim 1, wherein the neural network is a pretrained neural network and training the neural network on the training data comprises retraining the pretrained neural network on the training data.

8. The method of claim 1, wherein the neural network is an untrained neural network that is trained on the training data.

9. The method of claim 2, wherein the second region is a subset of the first region, such that the first region corresponds to a full field-of-view.

10. The method of claim 2, wherein the higher spatial resolution multispectral data have the second spatial resolution.

11. The method of claim 2, wherein the higher resolution multispectral data comprise at least one of spectral bin images or a composite image.

12. The method of claim 4, wherein the neural network is a pretrained neural network and training the neural network on the training data comprises one of retraining or fine-tuning the pretrained neural network on the training data.

13. The method of claim 5, wherein the multispectral data have a first contrast weighting and the magnetic resonance imaging data have a second contrast weighting that is different from the first contrast weighting, wherein the enhanced multispectral data depict the first region with the second contrast weighting.

14. The method of claim 6, wherein the multispectral data have a first spatial resolution and the magnetic resonance imaging data have a second spatial resolution that is higher than the first spatial resolution, wherein the enhanced multispectral data depict the first region with the second spatial resolution.

15. The method of claim 6, wherein the enhanced multispectral data comprise at least one of spectral bin images or a composite image.

16. The method of claim 7, wherein the pretrained neural network is retrained on the training data using transfer learning.

17. The method of claim 12, wherein the pretrained neural network is retrained or fine-tuned on the training data using transfer learning.

18. The method of claim 13, wherein the second contrast weighting comprises a vascular contrast weighting.

19. The method of claim 13, wherein the second contrast weighting comprises a diffusion weighting.

* * * * *